US012690214B2

(12) United States Patent
Zhu

(10) Patent No.: US 12,690,214 B2
(45) Date of Patent: Jul. 21, 2026

(54) SEMICONDUCTOR DEVICE WITH SPACER AND C-SHAPED CHANNEL PORTION, METHOD OF MANUFACTURING SEMICONDUCTOR DEVICE WITH SPACER AND C-SHAPED CHANNEL PORTION, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 421 days.

(21) Appl. No.: 18/343,634

(22) Filed: Jun. 28, 2023

(65) Prior Publication Data

US 2024/0096709 A1　Mar. 21, 2024

(30) Foreign Application Priority Data

Sep. 16, 2022　(CN) .......................... 202211133997.9

(51) Int. Cl.
　　*H10D 30/01*　　(2025.01)
　　*H10D 30/00*　　(2025.01)
　　(Continued)

(52) U.S. Cl.
　　CPC ......... *H10D 30/025* (2025.01); *H10D 30/508* (2025.01); *H10D 30/63* (2025.01);
　　(Continued)

(58) Field of Classification Search
　　CPC ............... H10D 62/122; H10D 62/292; H10D 84/0128; H10D 84/8316; H10D 84/832;
　　(Continued)

(56) References Cited

U.S. PATENT DOCUMENTS 9,793,401 B1 * 10/2017 Balakrishnan ......... H10D 30/63
2018/0248036 A1 * 8/2018 Leobandung ........ H10D 30/025
(Continued)

FOREIGN PATENT DOCUMENTS

CN 　111384156 　　7/2020
CN 　111384156 B ＊ 8/2021 ......... H10D 84/0128
(Continued)

OTHER PUBLICATIONS

First Chinese Office Action, issued in the corresponding Chinese patent application No. 202211133997.9, dated Jul. 12, 2025, 18 pages with the machine translation.

*Primary Examiner* — Christine S. Kim
*Assistant Examiner* — Tien Tran
(74) *Attorney, Agent, or Firm* — HSML P.C.

(57) ABSTRACT

Disclosed are a semiconductor device with a spacer and a C-shaped channel portion, a method of manufacturing the same, and an electronic apparatus including the semiconductor device. The semiconductor device may include: a channel portion on a substrate, wherein the channel portion includes a curved nanosheet or nanowire with a C-shaped cross-section; a first source/drain portion and a second source/drain portion respectively located at upper and lower ends of the channel portion with respect to the substrate; a first gate stack and a second gate stack located on opposite sides of the channel portion; a first spacer located between the first gate stack and the first source/drain portion and between the first gate stack and the second source/drain portion respectively; and a second spacer located between
(Continued)

the second gate stack and the first source/drain portion and between the second gate stack and the second source/drain portion respectively.

18 Claims, 26 Drawing Sheets

(51) Int. Cl.

| | | |
|---|---|---|
| *H10D 30/63* | (2025.01) | |
| *H10D 30/67* | (2025.01) | |
| *H10D 62/10* | (2025.01) | |
| *H10D 62/17* | (2025.01) | |
| *H10D 64/01* | (2025.01) | |
| *H10D 84/83* | (2025.01) | |
| *H10D 64/27* | (2025.01) | |
| *H10D 84/01* | (2026.01) | |

(52) U.S. Cl.

CPC ....... *H10D 30/6735* (2025.01); *H10D 62/122* (2025.01); *H10D 62/292* (2025.01); *H10D 64/021* (2025.01); *H10D 84/83* (2025.01); *H10D 64/519* (2025.01); *H10D 84/0128* (2025.01)

(58) Field of Classification Search

CPC .... H10D 30/025; H10D 30/43; H10D 30/508; H10D 30/63; H10D 64/021

See application file for complete search history.

(56) References Cited

U.S. PATENT DOCUMENTS

| | | | | |
|---|---|---|---|---|
| 2018/0331214 | A1* | 11/2018 | Cheng ................. | H10D 64/017 |
| 2019/0140080 | A1* | 5/2019 | Lee ......................... | H10D 30/63 |
| 2020/0118890 | A1* | 4/2020 | Bao ...................... | H10D 30/025 |
| 2020/0251557 | A1* | 8/2020 | Zhu ....................... | H10D 30/63 |
| 2021/0175344 | A1* | 6/2021 | Zhu ...................... | H10D 62/151 |
| 2021/0175356 | A1* | 6/2021 | Zhu ....................... | H10D 30/63 |
| 2021/0226004 | A1* | 7/2021 | Zhu ....................... | H10D 30/43 |
| 2022/0115498 | A1 | 4/2022 | Chu et al. | |
| 2023/0343851 | A1* | 10/2023 | Huang ................ | H10D 62/292 |

FOREIGN PATENT DOCUMENTS

| | | | | | |
|---|---|---|---|---|---|
| CN | | 113380893 | | 9/2021 | |
| CN | | 113380893 | A * | 9/2021 | ....... H01L 21/28088 |
| CN | | 215988757 | U * | 3/2022 | |
| WO | WO-2018059109 | A1 * | 4/2018 | ........... H10D 30/025 |

\* cited by examiner

1053

1055

1053

1047

1045

1001

A                                                                          A'

1017'

1013
1011
1009
1005

1003

1001

C                    C'

1017'

1009
1005

1003

1001

E                    E'

SEMICONDUCTOR DEVICE WITH SPACER AND C-SHAPED CHANNEL PORTION, METHOD OF MANUFACTURING SEMICONDUCTOR DEVICE WITH SPACER AND C-SHAPED CHANNEL PORTION, AND ELECTRONIC APPARATUS

CROSS REFERENCE TO RELATED APPLICATION

This application claims priority to Chinese Patent Application No. 202211133997.9, filed on Sep. 16, 2022, the entire content of which is incorporated herein in its entirety by reference.

TECHNICAL FIELD

The present disclosure relates to a field of semiconductors, in particular to a semiconductor device with a gate spacer and a channel portion of a C-shaped nanosheet or nanowire, a method of manufacturing the semiconductor device with the gate spacer and the channel portion of the C-shaped nanosheet or nanowire, and an electronic apparatus including the semiconductor device.

BACKGROUND

With a continuous miniaturization of a semiconductor device, devices with various structures such as Fin Field-Effect Transistor (FinFET), Multi-Bridge Channel Field-Effect Transistor (MBCFET), etc. are proposed. However, in terms of increasing an integration density and enhancing a device performance, a space for improvement of these devices still may not meet the requirements due to a device structure limitation. In addition, due to process fluctuations of photolithography, etching, and the like, it is difficult for a vertical nanosheet or nanowire device, such as a Metal Oxide Semiconductor Field Effect Transistor (MOSFET), to control a thickness or diameter of the nanosheet or nanowire.

In addition, in a horizontal device, a spacer may be provided on opposite sides (i.e., two sides of the gate stack facing source/drain regions opposite to each other in the lateral direction, respectively) of a gate stack in a lateral direction. Due to a limitation of a conventional spacer formation process, in a vertical device, it is difficult to form a spacer on the opposite sides (i.e., two sides of the gate stack facing source/drain regions opposite to each other in the vertical direction, respectively) of the gate stack in a vertical direction.

SUMMARY

In view of the above, an object of the present disclosure is at least in part to provide a semiconductor device with a gate spacer and a channel portion of a C-shaped nanosheet or nanowire, a method of manufacturing the semiconductor device with the gate spacer and the channel portion of the C-shaped nanosheet or nanowire, and an electronic apparatus including the semiconductor device.

According to an aspect of the present disclosure, there is provided a semiconductor device, including: a channel portion on a substrate, wherein the channel portion includes a curved nanosheet or nanowire with a C-shaped cross-section; a first source/drain portion and a second source/drain portion respectively located at upper and lower ends of the channel portion with respect to the substrate; a first gate stack and a second gate stack located on opposite sides of the channel portion; a first spacer located between the first gate stack and the first source/drain portion and between the first gate stack and the second source/drain portion respectively; and a second spacer located between the second gate stack and the first source/drain portion and between the second gate stack and the second source/drain portion respectively.

According to another aspect of the present disclosure, there is provided a method of manufacturing a semiconductor device, including: providing a stack of a first material layer, a second material layer and a third material layer on a substrate; patterning the stack into a ridge-like structure, wherein the ridge-like structure includes first and second sides opposite to each other in a first direction and third and fourth sides opposite to each other in a second direction intersecting the first direction; laterally recessing, on the third side and the fourth side, a sidewall of the second material layer with respect to a sidewall of the first material layer and a sidewall of the third material layer, so as to define a second recess portion; forming a channel layer on a surface of the second material layer exposed by the second recess portion; forming, in a remaining space of the second recess portion, a second position retaining layer and a first spacer located on an upper surface and a lower surface of the second position retaining layer; forming a source/drain portion in the first material layer and the third material layer; forming an opening in the first direction in the ridge-like structure, so as to divide the ridge-like structure into two portions opposite to each other in the second direction; removing the second material layer through the opening; forming, in a space released due to a removal of the second material layer, a third position retaining layer and a second spacer located on an upper surface and a lower surface of the third position retaining layer; forming an isolation layer on the substrate; removing the second position retaining layer and the third position retaining layer; and forming, on the isolation layer, a first gate stack and a second gate stack on opposite sides of the channel layer in the second direction.

According to another aspect of the present disclosure, there is provided an electronic apparatus including the semiconductor device described above.

According to embodiments of the present disclosure, a (gate) spacer is introduced in a vertical device with a C-shaped nanosheet or nanowire channel portion, so that an electrical separation distance between a gate stack, especially a conductor layer therein, and a source/drain region may be increased, and thus a growth of parasitic capacitance may be suppressed, especially in a case that a thickness of the conductor layer is increased to reduce a resistance.

BRIEF DESCRIPTION OF THE DRAWINGS

The above and other objectives, features and advantages of the present disclosure will be more apparent through the following description of embodiments of the present disclosure with reference to the accompanying drawings, in which:

FIG. 1 to FIG. 25 schematically illustrate some stages in a process of manufacturing a semiconductor device according to an embodiment of the present disclosure;

FIG. 26(a) to FIG. 32(b) schematically illustrate some stages in a process of manufacturing a semiconductor device according to another embodiment of the present disclosure, wherein:

FIGS. 5(a), 8(a), 21(a), 22, 23(a), 24(a), 25, 26(a), and 27(a) are top views, wherein FIG. 5(a) shows positions of line AA' and line CC' for taking a cross-sectional view, FIG.

Figure 19A:
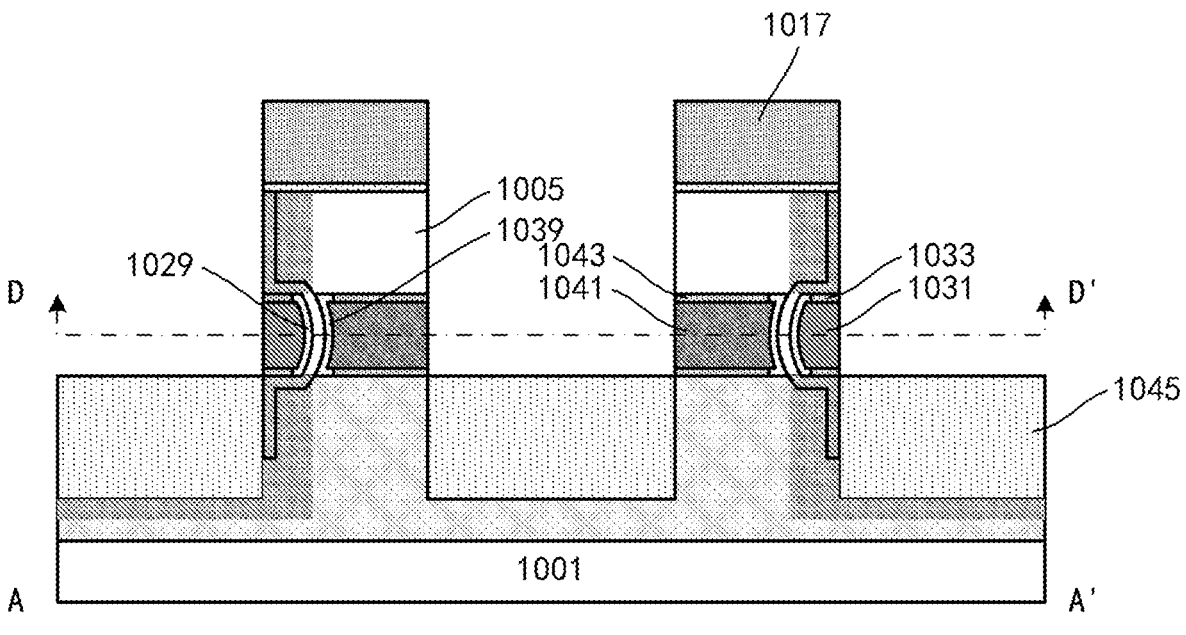
Figure 19B:
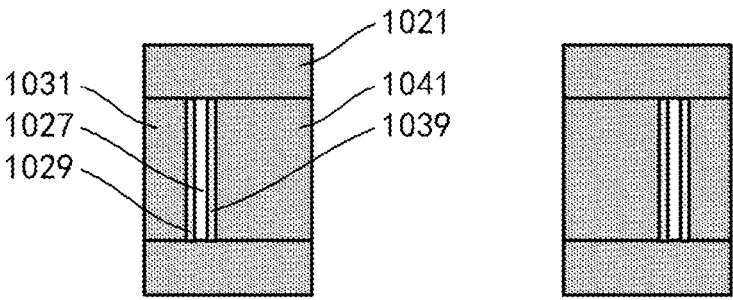
Figure 27A:
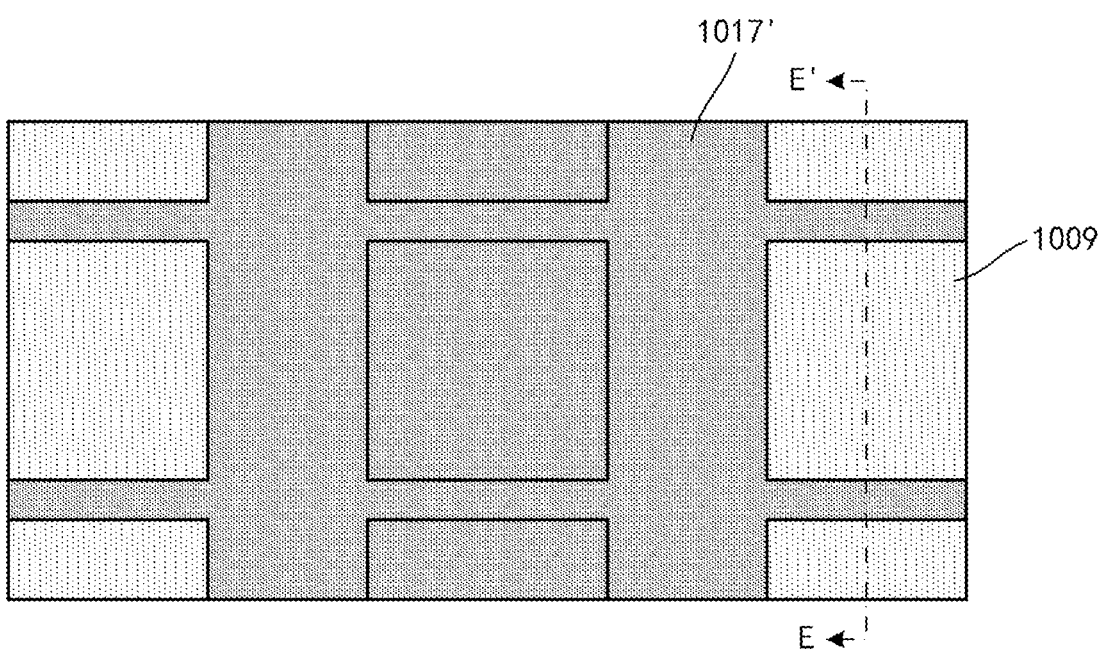
Figure 27B:
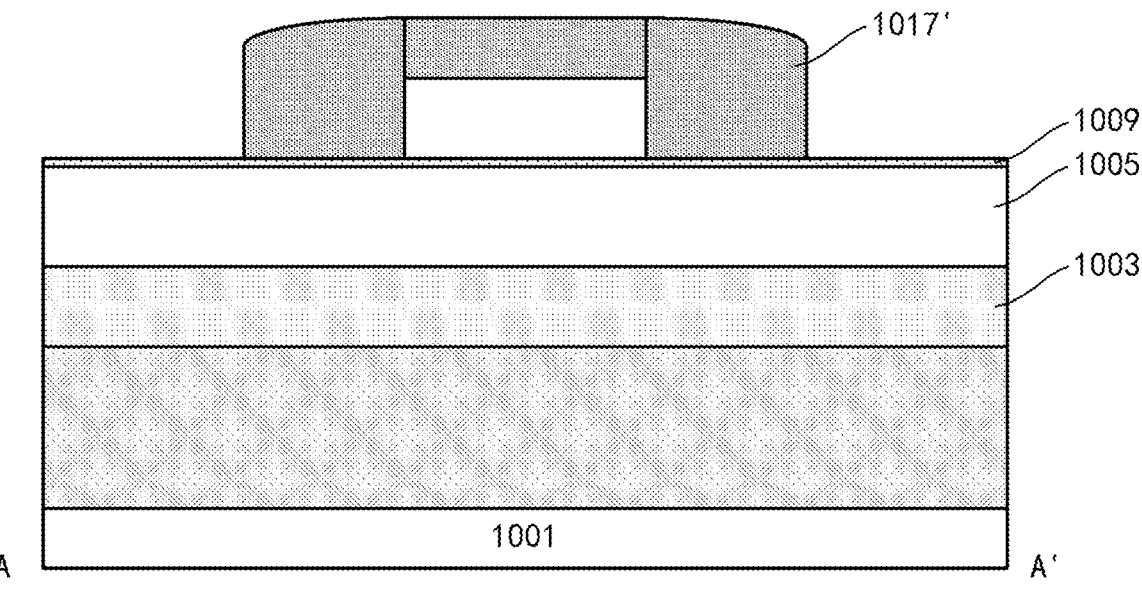
Figures 27C, 27D:
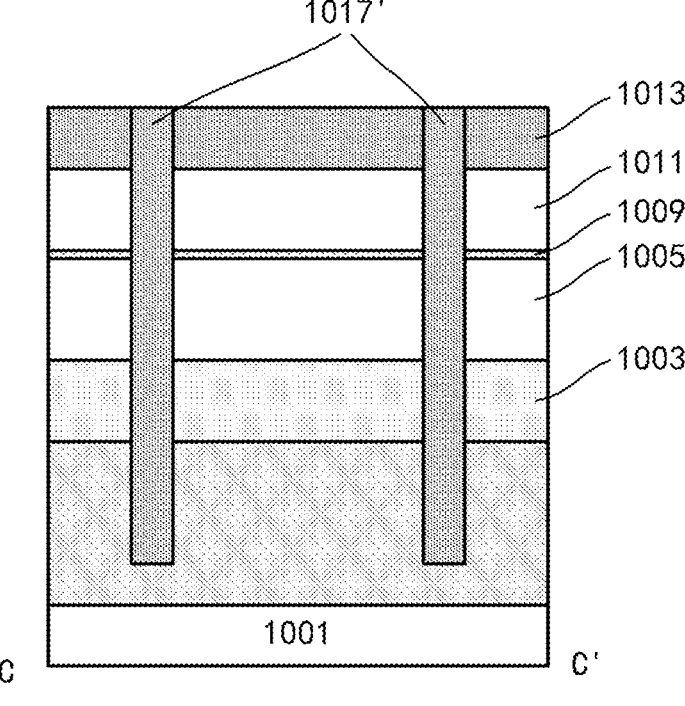

8(*a*) shows a position of line BB' for taking a cross-sectional view, and FIG. 27(*a*) shows a position of line EE' for taking a cross-sectional view;

FIGS. 1 to 4, 5(*b*), 8(*b*), 9 to 15, 16(*a*), 16(*b*), 17, 18, 19(*a*), 20, 21(*b*), 23(*b*), 24(*b*), 26(*b*), 27(*b*), 28(*a*), 29 to 31, and 32(*a*) are cross-sectional views along line AA';

FIG. 8(*c*) is a cross-sectional view along line BB';

FIGS. 5(*c*), 6, 7, 8(*d*), 26(*c*), and 27(*c*) are cross-sectional views along line CC';

FIGS. 19(*b*), 21(*c*), 23(*c*), 28(*b*), and 32(*b*) are cross-sectional views taken along line DD', wherein a position of line DD' is shown in FIG. 19(*a*); and FIG. 27(*d*) is a cross-sectional view along line EE'.

Throughout the accompanying drawings, the same or similar reference numerals indicate the same or similar components.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to embodiments of the present disclosure are shown in the accompanying drawings. The figures are not drawn to scale. Some details are enlarged and some details may be omitted for clarity of presentation. The shapes of various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes, and relative positions according to the actual needs.

In the context of the present disclosure, when a layer/element is referred to as being "on" a further layer/element, the layer/element may be directly on the further layer/element, or there may be an intermediate layer/element between them. In addition, if a layer/element is located "on" a further layer/element in one orientation, the layer/element may be located "under" the further layer/element when the orientation is reversed.

According to embodiments of the present disclosure, there is provided a vertical semiconductor device, which has an active region disposed vertically (e.g., in a direction substantially perpendicular to a surface of a substrate) on the substrate. A channel portion may be a curved nanosheet or nanowire with a C-shaped cross-section (e.g., a cross-section perpendicular to the surface of the substrate), thus the device may be referred to a C-Channel Field Effect Transistor (C-Channel FET, CCFET). As described below, the nanosheet or nanowire may be formed through an epitaxial growth, thus the nanosheet or nanowire may be an integrated monolithic piece and have a substantially uniform thickness or diameter.

The semiconductor device may further include source/drain portions respectively disposed at upper and lower ends of the channel portion. A size of the source/drain portion with respect to the substrate in a lateral direction may be greater than a size of the channel portion in a corresponding direction, so as to ensure that the upper and lower ends of the channel portion are connected to the source/drain portion. The source/drain region may have a certain amount of doping. For example, for a p-type device, the source/drain portion may have a p-type doping; for an n-type device, the source/drain portion may have an n-type doping. The channel portion may have a certain amount of doping to adjust a threshold voltage of the device. Alternatively, the semiconductor device may be a junction-less device, wherein the channel portion and the source/drain portion may have a same conductive type of doping. Alternatively, the semiconductor device may be a tunnel device, wherein the source/drain portions at two ends of the channel portion may have opposite doping types to each other.

The source/drain portion may be disposed in a corresponding semiconductor layer. For example, the source/drain portion may be a doped region in the corresponding semiconductor layer. The source/drain portion may be a part or all of the corresponding semiconductor layer. In a case that the source/drain portion is a part of the corresponding semiconductor layer, there may be a doping concentration interface between the source/drain portion and the rest of the corresponding semiconductor layer. As described below, the source/drain portion may be formed through diffusion doping. In this case, the doping concentration interface may be substantially along a vertical direction with respect to the substrate.

The channel portion may include a single crystal semiconductor material. Certainly, the source/drain portions or the semiconductor layer in which the source/drain portions are formed may also include a single crystal semiconductor material. For example, they may all be formed through an epitaxial growth.

The semiconductor device may further include a first gate stack and a second gate stack on opposite sides of the channel portion. The first gate stack and the second gate stack may be separated from each other, and thus different configurations and/or different biases may be applied to optimize a device performance. Alternatively, the first gate stack and the second gate stack may be connected to each other (and may form a whole), so as to form an outer periphery surrounding the channel portion. Therefore, the semiconductor device according to embodiments of the present disclosure may be a gate-all-around device. According to embodiments of the present disclosure, the gate stack may be self-aligned to the channel portion. For example, at least a portion of the gate stack close to a side of the channel portion may be substantially coplanar with the channel portion. For example, the portion of the gate stack is substantially coplanar with an upper surface and/or a lower surface of the channel portion.

According to embodiments of the present disclosure, a spacer may be provided between the gate stack and the source/drain portion. The spacer may increase a spacing or electrical isolation distance between the gate stack, especially a conductor layer therein, and the source/drain portion, thereby reducing a parasitic capacitance. The spacer generally does not extend to a surface of the gate stack facing the channel portion, so as to avoid affecting a control effect of the gate stack on a channel region in the channel portion.

As described below, the spacer may be formed in a self-aligned manner. Specifically, the spacer may be self-aligned with the upper and lower ends of the channel portion, respectively. Self-alignment refers to that a relative position between structures is substantially unaffected by a process fluctuation, especially a photolithography fluctuation. The self-aligned structure is detectable. For example, there may be a plurality of such devices in an integrated circuit (IC). If the structure is self-aligned, a position relationship of the spacer relative to an end portion of the channel portion in each device may remain substantially unchanged. If the structure is not self-aligned, such relative position relationship may have a process fluctuation between devices. Similar to a horizontal device in which the spacer substantially extends in a vertical direction, the spacer according to embodiments of the present disclosure may extend in a lateral direction.

The semiconductor device may be manufactured, for example, as follows.

According to an embodiment, a stack of a first material layer, a second material layer and a third material layer may be provided on a substrate. The first material layer may define a position of a lower source/drain portion, the second material layer may define a position of a gate stack, and the third material layer may define a position of an upper source/drain portion. The first material layer may be provided through the substrate, e.g., an upper portion of the substrate. The second material layer and the third material layer may be sequentially formed on the first material layer, for example, by an epitaxial growth. Alternatively, the first material layer, the second material layer, and the third material layer may be formed sequentially on the substrate, for example, by an epitaxial growth. The first material layer and the third material layer may be doped in situ during the epitaxial growth, so as to form source/drain portions therein.

The stack may be patterned as a ridge-like structure. The ridge-like structure may include a first side and a second side opposite to each other in a first direction, and a third side and a fourth side opposite to each other in a second direction that intersects (e.g., perpendicular to) the first direction. For example, the ridge-like structure may be quadrilateral such as rectangle or square in a plan view. A channel portion may be formed on a pair of opposite sidewalls (such as the third side and the fourth side) of the ridge-like structure.

A shielding material may be formed on the first side and the second side of the ridge-like structure. In this way, a subsequent processing may not affect the first side and the second side of the ridge-like structure, so that gate stacks separated from each other may be formed on the third side and the fourth side of the ridge-like structure. Alternatively, in order to subsequently form a gate stack surrounding the channel portion, a space for forming the gate stack may be defined on the first side and the second side of the ridge-like structure. For example, a sidewall of the second material layer may be laterally recessed with respect to a sidewall of the first material layer and a sidewall of the third material layer on the first side and the second side of the ridge-like structure, so as to define the first recess portion. The first recess portion may have a curved surface recessed towards an inner side of the ridge-like structure. A first position retaining layer may be formed in the first recess portion.

Similarly, the sidewall of the second material layer may be laterally recessed with respect to the sidewall of the first material layer and the sidewall of the third material layer on the third side and the fourth side of the ridge-like structure, thereby defining a second recess portion to define a space for the gate stack. The second recess portion may have a curved surface recessed towards the inner side of the ridge-like structure. A channel portion may be formed on a surface of the second recess portion. For example, a first active layer may be formed by an epitaxial growth on an exposed surface of the ridge-like structure. A portion of the first active layer located on the surface of the second recess portion may be used as the channel portion (which is also referred to a "channel layer"). Based on the first active layer on the sidewalls of the third and fourth sides of the ridge-like structure, devices may be formed respectively. Accordingly, two devices that are opposite to each other may be formed based on a single ridge-like structure. A second position retaining layer may be formed in the second recess portion having the channel layer formed on the surface of the second recess portion.

After defining the second recess portion and before forming the first active layer, the exposed surface of the ridge-like structure may be etched back by a certain amount, such as substantially a thickness of the first active layer to be formed, which is conducive to ensuring that subsequent gate stacks formed on opposite sides of the channel portion have substantially equal gate lengths.

Source/drain portions may be formed in the first material layer and the third material layer. For example, the source/drain portions may be formed by doping the first material layer and the third material layer (especially when the first material layer and the third material layer are not doped at the time of formation). Such doping may be achieved through a solid-state dopant source layer.

An opening may be formed in the ridge-like structure to separate active regions of two devices. The opening may further extend in the first direction, so that the ridge-like structure is divided into two portions opposite in the second direction, wherein the two portions have respective channel layers. The second material layer may be removed through the opening, and a third position retaining layer may be formed in a space released due to a removal of the second material layer.

According to embodiments of the present disclosure, when forming each of the first position retaining layer, the second position retaining layer, and the third position retaining layer, spacers are also formed on their respective upper and lower surfaces. For example, a spacer position defining layer may be formed in a substantially conformal manner, and then a corresponding position retaining layer may be formed. The spacer position defining layer (portions of the spacer position defining layer on the upper and lower surfaces of the corresponding position retaining layer) is selectively etched with the corresponding position retaining layer as a mask to release a space, and the space thus released is filled with a spacer material such as a dielectric to form the spacer.

A replacement gate process may be performed to replace the second position retaining layer and the third position retaining layer (and the first position retaining layer, if present) with the gate stack, so as to form the gate stack that overlaps with the channel portion. The spacers on the upper and lower surfaces of the second position retaining layer and the third position retaining layer (and the first position retaining layer, if present) may be between the gate stack and the source/drain portion, so as to form a gate spacer.

According to embodiments of the present disclosure, a thickness and a gate length of the nanosheet or nanowire used as the channel portion are mainly determined by the epitaxial growth, rather than by etching or photolithography, thus enabling good channel dimension/thickness and gate length control.

The present disclosure may be presented in a variety of forms, some examples of which will be described below. In the following description, a selection of various materials is involved. In the selection of materials, in addition to a function of the material (for example, a semiconductor material may be used to form the active region, and a dielectric material may be used to form an electrical isolation), an etching selectivity is also considered. In the following description, a required etching selectivity may or may not be indicated. It should be clear to those skilled in the art that when etching a material layer is mentioned below, if it is not mentioned or shown in figures that other layers are also etched, then the etching may be selective, and the material layer may have an etching selectivity with respect to other layers exposed to the same etching recipe.

FIG. 1 to FIG. 25 schematically illustrate some stages in a process of manufacturing a semiconductor device according to an embodiment of the present disclosure.

Figure 1:
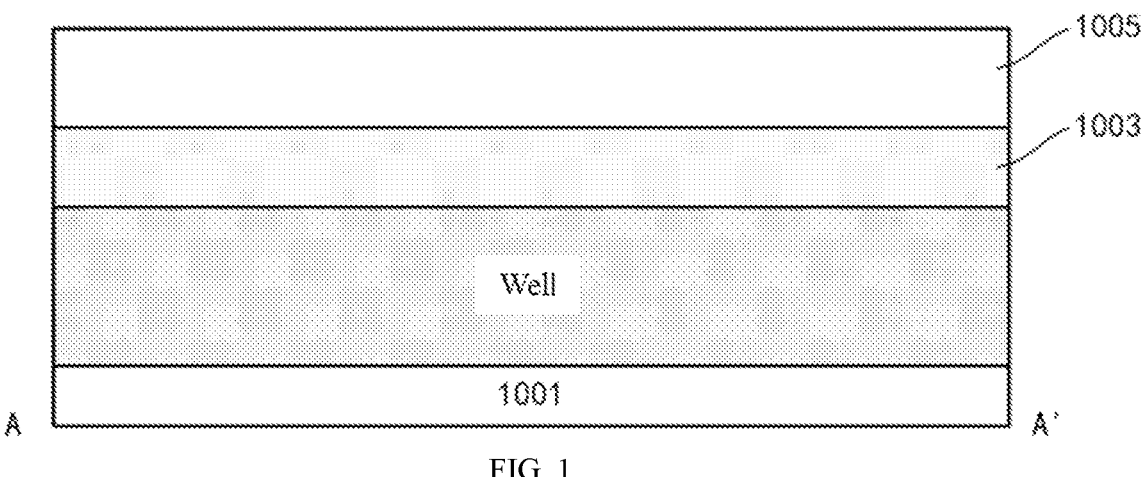

As shown in FIG. 1, a substrate 1001 (an upper portion of which may form the first material layer described above) is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of explanation, the bulk Si substrate is illustrated by way of example. Here, a silicon wafer is provided as the substrate 1001.

A well region may be formed in the substrate 1001. If a p-type device is to be formed, the well region may be an n-type well. If an n-type device is to be formed, the well region may be a p-type well. The well region may be formed, for example, by injecting a corresponding conductive type dopant (a p-type dopant such as B or In, or an n-type dopant such as As or P) into the substrate 1001 and subsequently undergoing thermal annealing. There are a plurality of ways in the art to provide the well region, which will not be described in detail here.

A second material layer 1003 and a third material layer 1005 may be formed by, for example, an epitaxial growth on the substrate 1001. The second material layer 1003 may be used to define a position of a gate stack, and have a thickness of about 20 nm to 50 nm. The third material layer 1005 may be used to define a position of an upper source/drain portion, and have a thickness of about 20 nm to 200 nm.

Adjacent layers in the substrate 1001 and the above-mentioned layers formed on the substrate 1001 may have an etching selectivity with respect to each other. For example, in a case that the substrate 1001 is the silicon wafer, the second material layer 1003 may contain SiGe (for example, an atomic percentage of Ge is about 10% to 30%), and the third material layer 1005 may contain Si.

Figure 2:
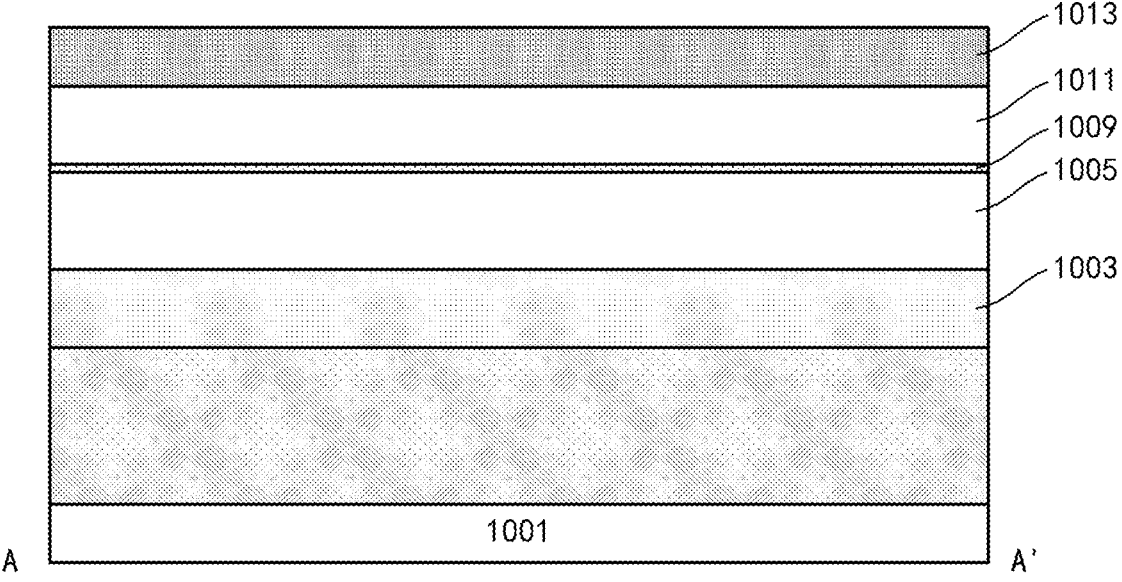

According to the embodiment, a spacer pattern transfer technology may be used in the following patterning. A mandrel may be formed in order to form a spacer. For example, as shown in FIG. 2, a layer 1011 for the mandrel may be formed on the third material layer 1005 by, for example, deposition. For example, the layer 1011 for the mandrel may contain amorphous silicon or polysilicon, and have a thickness of about 50 nm to 150 nm. In addition, for a better etching control, an etching stop layer 1009 may be formed first by, for example, deposition. For example, the etching stop layer 1009 may contain an oxide (e.g., silicon oxide), and have a thickness of about 1 nm to 10 nm.

On the layer 1011 for the mandrel, a hard mask layer 1013 may be formed, for example, by deposition. For example, the hard mask layer 1013 may contain a nitride (e.g., silicon nitride), and have a thickness of about 30 nm to 100 nm.

The layer 1011 for the mandrel may be patterned as the mandrel.

Figures 3, 4:
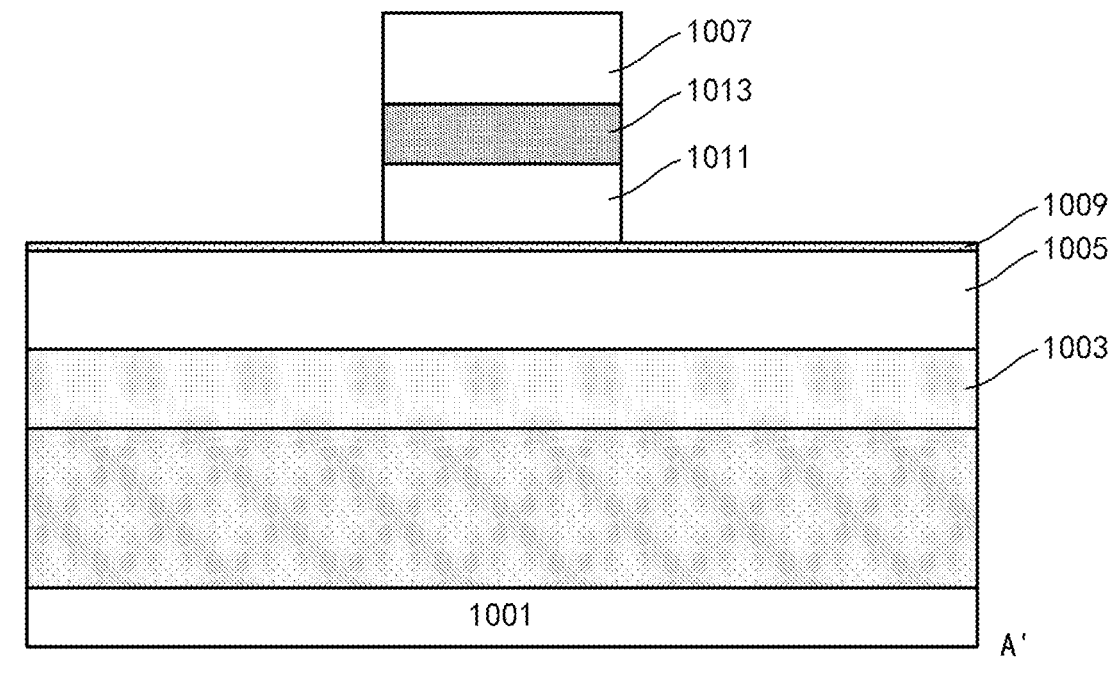

For example, as shown in FIG. 3, a photoresist 1007 may be formed on the hard mask layer 1013, and may be patterned into a strip shape extending in a first direction (a direction perpendicular to a paper plane in FIG. 3) by photolithography. The photoresist 1007 may be used as an etching mask to selectively etch the hard mask layer 1013 and the layer 1011 for the mandrel sequentially by, for example, Reactive Ion Etching (RIE), so that a pattern of the photoresist may be transferred to the hard mask layer 1013 and the layer 1011 for the mandrel. The etching may stop at the etching stop layer 1009. After that, the photoresist 1007 may be removed.

As shown in FIG. 4, a spacer 1017 may be formed on sidewalls of opposite sides of the mandrel 1011 in a second direction (a horizontal direction within a paper plane in FIG. 4) that intersects (e.g., perpendicular to) the first direction. For example, a layer of nitride with a thickness of about 10 nm to 100 nm may be deposited in a substantially conformal manner, and then anisotropic etching such as RIE (which may stop at the etching stop layer 1009) may be performed on the deposited nitride layer in the vertical direction to remove a lateral extending portion of the deposited nitride layer and leave a vertical extending portion of the deposited nitride layer, so as to obtain the spacer 1017. The spacer 1017 may then be used to define a position of an active region of the device.

The mandrel formed as described above and the spacer 1017 formed on a sidewall of the mandrel extend in the first direction. A range of the mandrel and the spacer 1017 in the first direction may be defined, and thus a range of the active region of the device in the first direction may be defined.

Figure 5A:
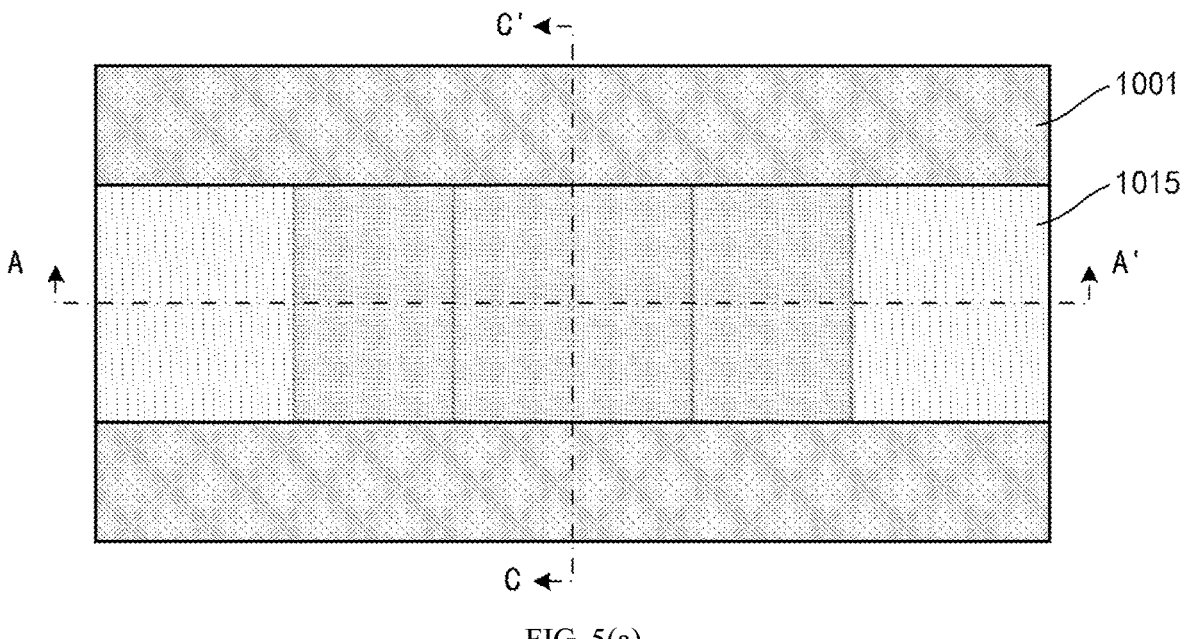
Figure 5B:
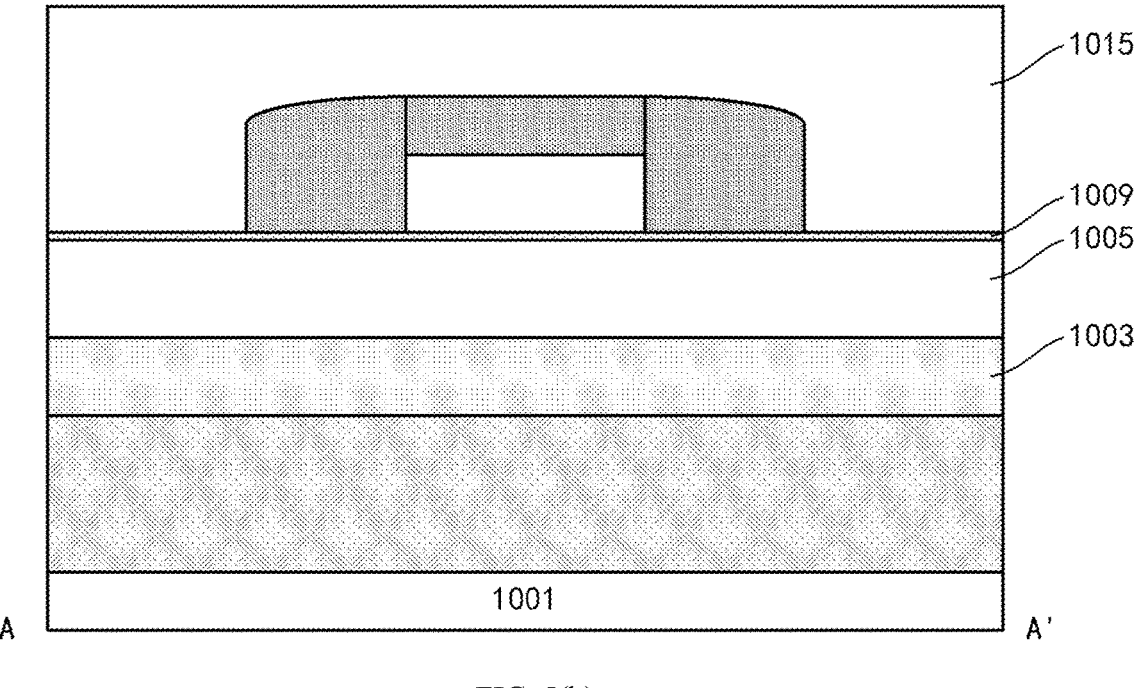
Figure 5C:
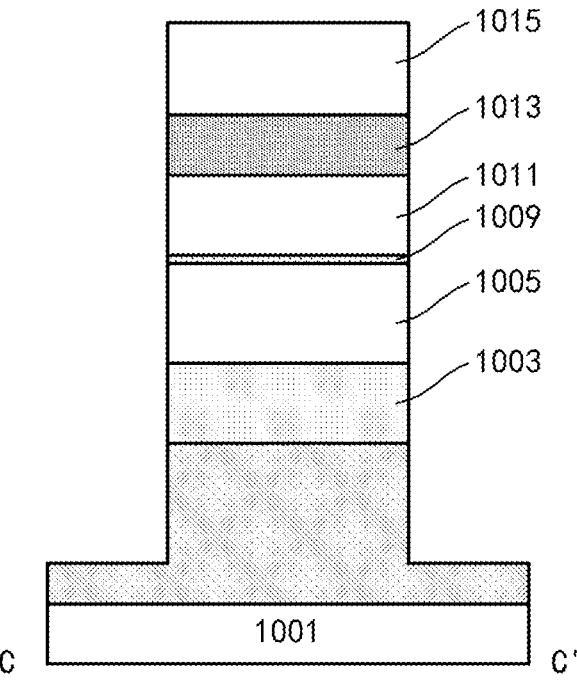

As shown in FIG. 5(a) to FIG. 5(c), a photoresist 1015 may be formed on a structure shown in FIG. 4 and patterned by photolithography as occupying a certain range in the first direction, e.g., a strip shape extending in the second direction perpendicular to the first direction. The photoresist 1015 may be used as an etching mask to selectively etch lower layers sequentially by, for example, RIE in the vertical direction. The etching may be performed into the substrate 1001, especially into the well region in the substrate 1001, so as to form a groove in the substrate 1001. Isolation such as shallow trench isolation (STI) may subsequently be formed in the formed groove. After that, the photoresist 1015 may be removed.

As shown in FIG. 5(c), the sidewall of the second material layer 1003 in the first direction is currently exposed.

According to embodiments of the present disclosure, in order to form a gate stack surrounding the channel portion, spaces for the gate stack may be left at two ends of the second material layer in the first direction.

Figure 6:
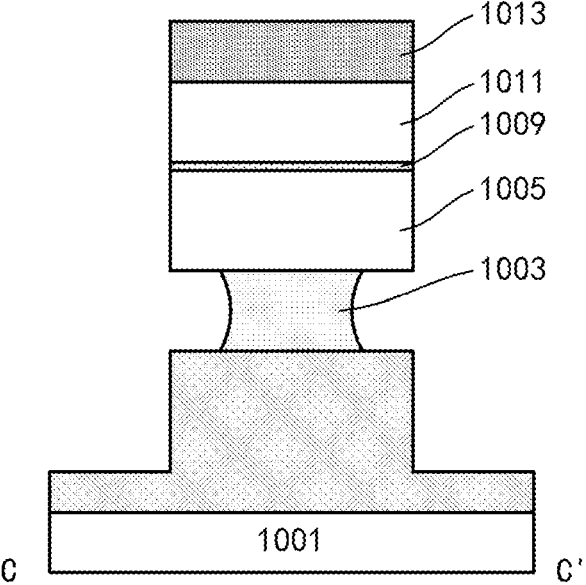

To this end, as shown in FIG. 6, the second material layer 1003 may be selectively etched, so that the sidewall of the second material layer 1003 in the first direction is relatively recessed. In order to better control an amount of etching, Atomic Layer Etching (ALE) may be adopted. For example, hydrogen (H) and/or helium (He) may be used to modify the channel layer 1003 (here, SiGe), and then the modified layer may be removed by wet etching or groups such as $NH_3$ and $NF_3$. The process may be repeated until a desired etching depth, e.g., about 5 nm to 20 nm, is achieved. Depending on an etching characteristic, such as the etching selectivity of the second material layer 1003 with respect to the substrate 1001 and the third material layer 1005, the sidewall of the etched second material layer 1003 may have different shapes. FIG. 6 shows that the sidewall of the etched second material layer 1003 is a C-shape recessed inwardly. However, the present disclosure is not limited to this. For example, when the etching selectivity is good, the sidewall of the etched second material layer 1003 may be close to be vertical. Here, the etching may be isotropic, especially when a large etching amount is required.

In the recess thus formed, (a portion of) the gate stack is subsequently formed. According to embodiments of the present disclosure, the spacer may be formed. Generally speaking, the spacer may be formed on opposite sides (in a case of the vertical device, upper and lower sides) of the gate stack facing the source/drain region, respectively, rather than formed on a side of the gate stack facing the channel region. A formation space of the spacer may be defined by combining the spacer position defining layer with the position retaining layer formed in the recess.

Figure 7:
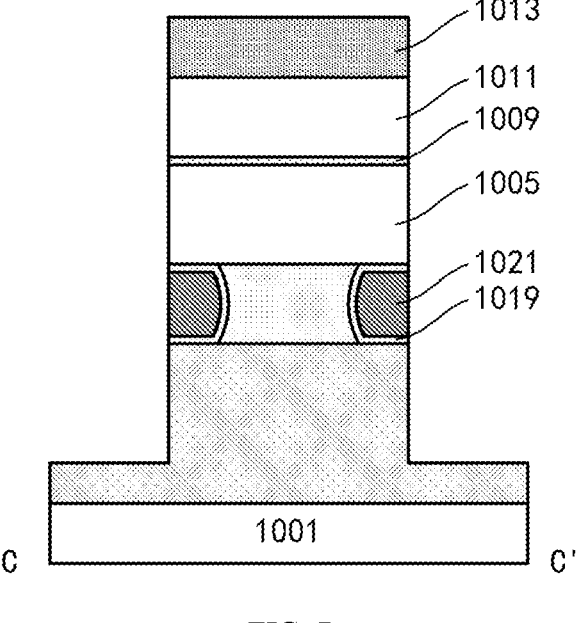
Figure 8A:
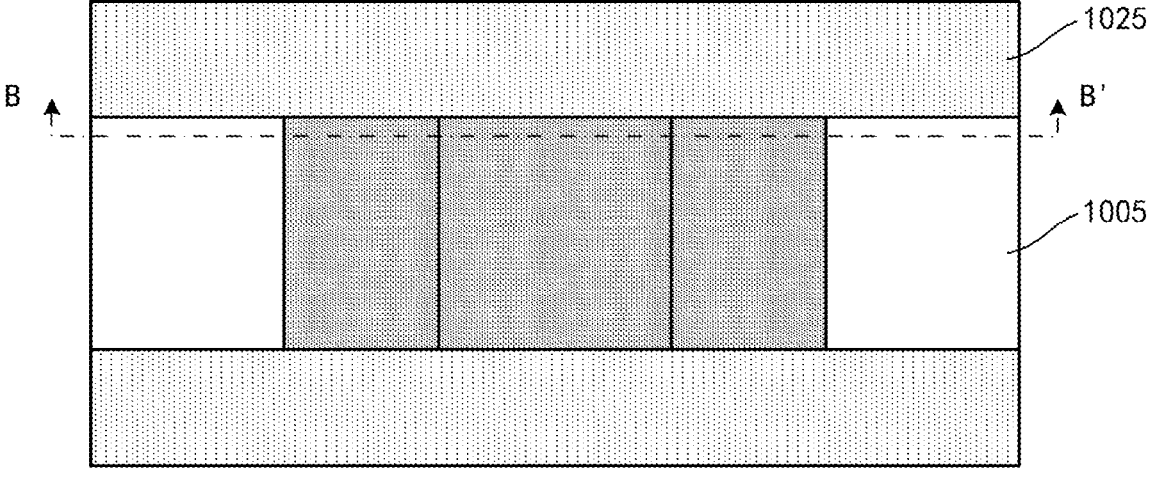
Figure 8B:
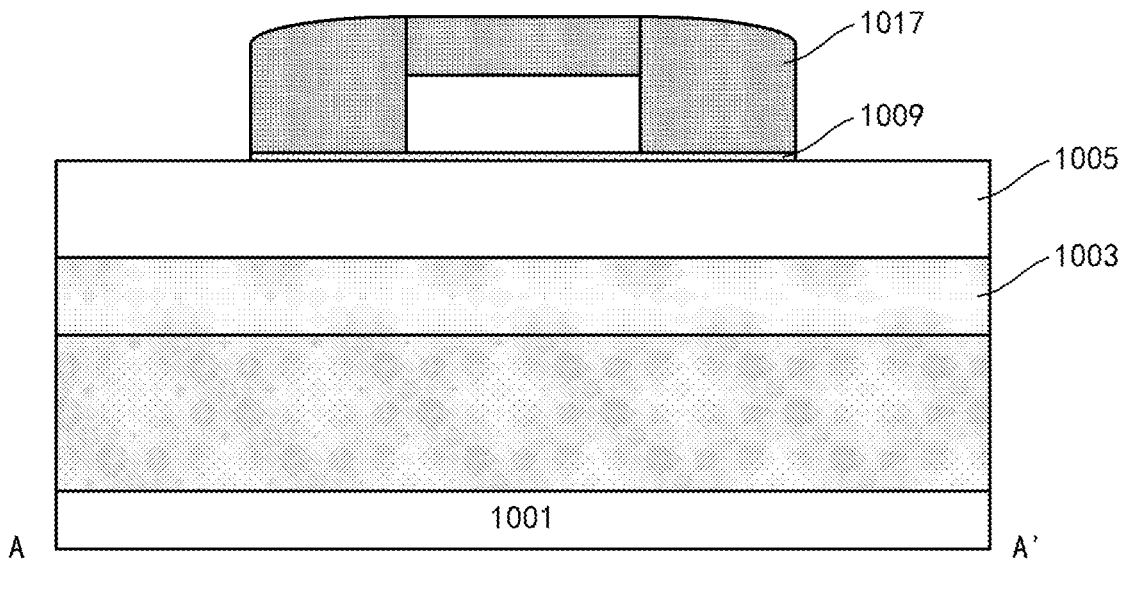
Figure 8C:
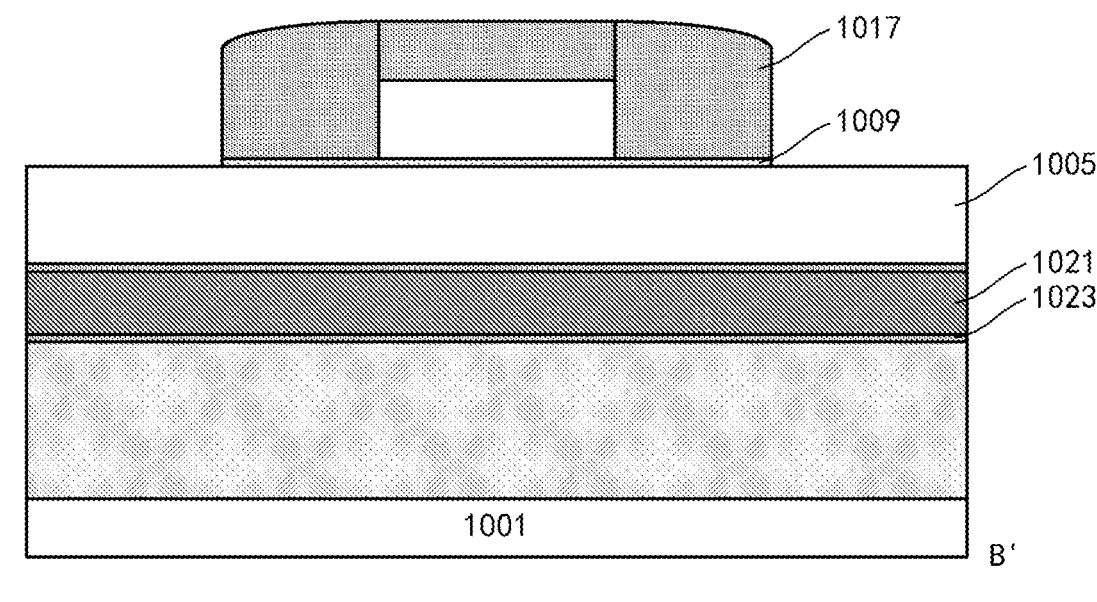
Figure 8D:
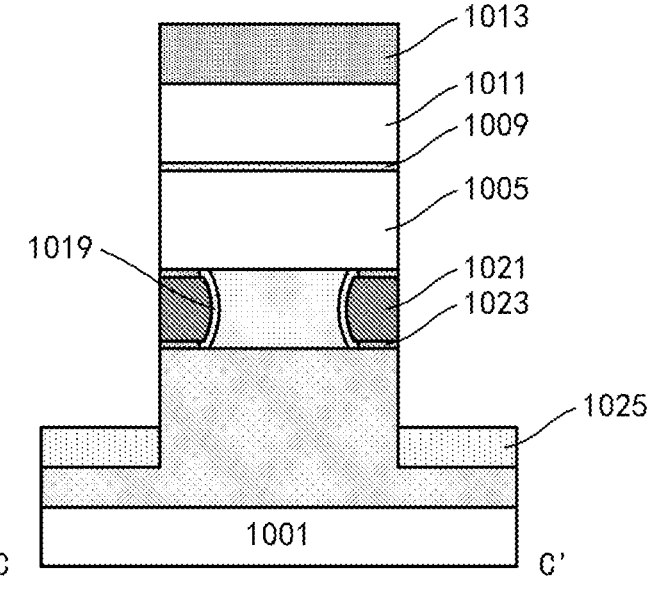

For example, as shown in FIG. 7, a spacer position defining layer 1019 may be formed in the recess by an epitaxial growth or a deposition. The spacer position defining layer 1019 may be formed in a substantially conformal manner, thereby extending along a surface of the structure. Considering the etching selectivity in a subsequent process, the spacer position defining layer 1019 may contain, for example, SiGe with a thickness of about 2 nm to 10 nm. A first position retaining layer 1021 may be formed in the recess in which the spacer position defining layer 1019 is formed. For example, a dielectric material such as SiC that is sufficient to fully fill the recess may be deposited on the substrate, and then the deposited dielectric material may be etched back by, for example, RIE in the vertical direction. In this way, the dielectric material outside a range defined by the hard mask layer 1013 and the spacer 1017 may be removed, and the dielectric material is left in the above-mentioned recess to form the first position retaining layer 1021. In addition, during the etching back process, the spacer position defining layer 1019 formed on surfaces other than the recess may also be removed (or, even if not removed, the subsequent process is not influenced, thus the spacer position defining layer 1019 is shown to be only formed within the recess in the drawings).

Then, as shown in FIG. 8(*a*) to FIG. 8(*d*), the spacer position defining layer 1019 may be etched back by the selective etching with the first position retaining layer 1021 as a mask. For the etching back of the spacer position defining layer 1019, a space on an upper side and an lower side of the first position retaining layer 1021 may be released, and a portion of the spacer position defining layer 1019 (in this example, a portion of the spacer position defining layer 1019 extending on a surface of the second material layer 1003) facing the channel region may be left. In order to ensure a process margin, the left spacer position defining layer 1019 may extend slightly to the upper and lower surfaces of the first position retaining layer 1021 in addition to the portion of the spacer position defining layer 1019 extending on the surface of the second material layer 1013. Since the etching on the upper and lower sides is substantially performed equally, lengths of the spacer position defining layer 1019 extending on the upper and lower surfaces of the first position retaining layer 1021 may be substantially the same. Here, in order to better control an amount of etching, the ALE may be adopted.

In a space released due to the etching back of the spacer position defining layer 1019, a spacer may be formed. For example, a thin spacer material layer may be formed by deposition such as Chemical Vapor Deposition (CVD) or Atomic Layer Deposition (ALD). Considering the etching selectivity (e.g., with respect to the first position retaining layer 1021, etc.), the spacer material layer may contain a nitride. The spacer material layer may be formed in a substantially conformal manner, and a deposition thickness of the spacer material layer allows the space on the upper and lower sides of the first position retaining layer 1021 to be fully filled with the deposited spacer material layer. Then, anisotropic etching such as RIE may be performed on the deposited spacer material layer. RIE may be performed in the vertical direction, and an etching amount may be greater than the deposition thickness, so that a portion of the spacer material layer outside the recess may be removed, and a portion of the spacer material layer inside the recess may be retained, so as to form a spacer 1023.

Portions of the spacer 1023 on the upper and lower sides of the first position retaining layer 1021 occupy a space where the spacer position defining layer 1019 was originally located (therefore, a thickness of the spacer 1023 is substantially the same as a thickness of the spacer position defining layer 1019, and the spacer 1023 and the spacer position defining layer 1019 may be substantially coplanar, for example, at the upper surface and/or the lower surface of the first position retaining layer 1021), thus the spacer 1023 may be self-aligned with the spacer position defining layer 1019. In addition, the spacer position defining layer 1019 may be self-aligned with the second material layer 1003 (and thus may be self-aligned with the channel region formed in the second material layer 1003). Therefore, the portions of the spacer 1023 on the upper and lower sides of the first position retaining layer 1021 may be self-aligned with the upper and lower ends of the channel region.

According to embodiments of the present disclosure, a protective layer 1025 may be formed on the substrate 1001. For example, an oxide layer may be formed on the substrate 1001 by deposition, and the deposited oxide layer is further etched back after a planarization process such as a Chemical Mechanical Polishing (CMP) (the CMP may stop at the hard mask layer 1013) may be performed on the deposited oxide layer, so as to form the protective layer 1025. Here, the protective layer 1025 may be located in the groove of the substrate 1001, and a top surface of the protective layer 1025 is lower than a top surface of the substrate 1001. In addition, during the etching back process, an exposed portion of the etching stop layer 1009 (also an oxide in the example) may also be etched. According to other embodiments, an operation of forming the protective layer 1025 may be performed before selectively etching the second material layer 1003 to recess the second material layer 1003, or before an operation of etching back the spacer position defining layer 1019.

The protective layer 1025 may protect a surface of the substrate 1001. For example, in the example, a range of the active region in the first direction is first defined. Subsequently, a range of the active region in the second direction is defined. The protective layer 1025 may avoid affecting a surface of the substrate in the groove currently exposed when defining the range of the active region in the second direction (see FIG. 5(*c*) and FIG. 7). In addition, in a case that different types of well regions are formed in the substrate 1001, the protective layer 1025 may protect a pn junction between different types of well regions from being destroyed by etching (for example, the etching back when forming the first position retaining layer 1021).

Figure 9:
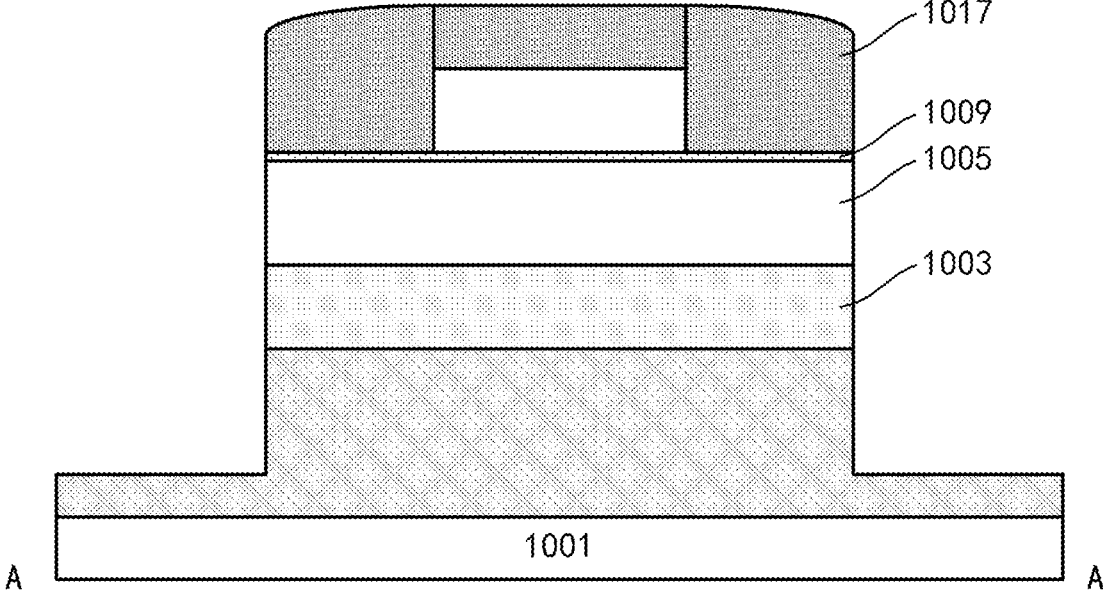

As shown in FIG. 9, the third material layer 1005, the second material layer 1003, and an upper portion (the first material layer) of the substrate 1001 may be patterned as a ridge-like structure by using the hard mask layer 1013 and the spacer 1017 (in fact, a range of the ridge-like structure in the first direction has been defined by the above-mentioned processing). For example, each layer may be selectively etched by, for example, RIE in the vertical direction with the hard mask layer 1013 and the spacer 1017 as etching masks to transfer the pattern to the lower layers. Accordingly, the upper portion of the substrate 1001, the second material layer 1003, and the third material layer 1005 may form the ridge-like structure. As mentioned above, due to a presence of the protective layer 1025, the etching may not affect portions of the substrate 1001 on two sides of the ridge-like structure in the first direction.

Here, the etching may enter a well region of the substrate 1001. A degree of the etching entering the substrate 1001 may be substantially the same or similar to a degree of the etching entering the substrate 1001 described above in combination with FIG. 5(a) to FIG. 5(c). Similarly, grooves are formed in the substrate 1001, and a protective layer (see a portion also labeled as 1025 in FIG. 10) may also be formed in the grooves. The protective layer, along with the previous protective layer (labeled as 1025 as a whole), surrounds an outer periphery of the ridge-like structure. In this way, similar processing conditions may be achieved around the ridge-like structure, that is, grooves are formed in the substrate 1001, and the protective layer 1025 is formed in the grooves.

Figure 10:
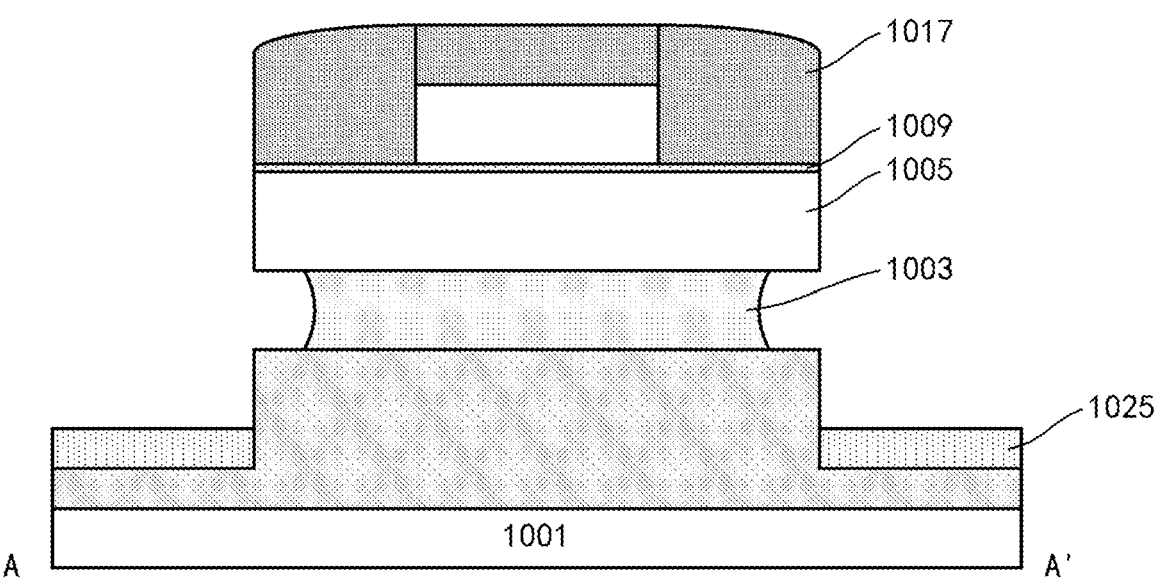

Similarly, in order to form a gate stack surrounding the channel portion, spaces may be left at two ends of the second material layer in the second direction for the gate stack. For example, as shown in FIG. 10, the second material layer 1003 may be selectively etched such that sidewalls of the second material layer 1003 in the second direction are relatively recessed (which may define the space for the gate stack). In order to better control an amount of etching, the ALE may be adopted. For example, the amount of etching may be about 10 nm to 40 nm. As mentioned above, a sidewall of the etched second material layer 1003 may have a C-shape recessed inward. Here, the etching may be isotropic, especially when a large etching amount is required. Generally, the C-shaped sidewall of the second material layer 1003 has a larger curvature at upper and lower ends and a smaller curvature at a waist or middle portion.

Figure 11:
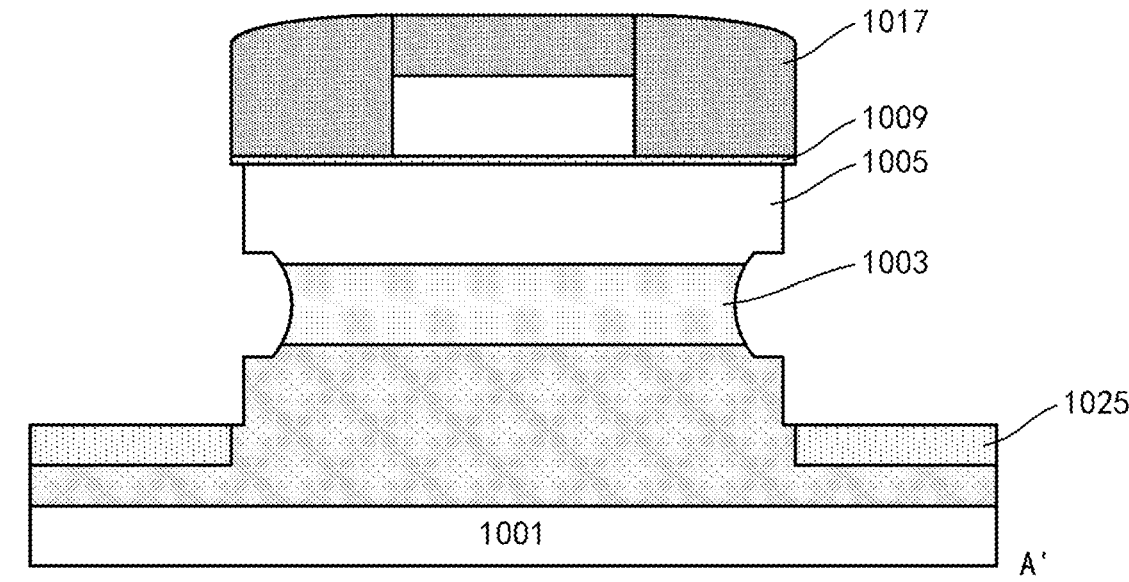

A first active layer may be formed on a sidewall of the ridge-like structure to subsequently define the channel portion. In order to ensure that the gate lengths (e.g., in a direction perpendicular to the surface of the substrate) of the gate stacks are substantially equal when the gate stacks are subsequently formed on the left and right sides of the C-shaped channel portion, as shown in FIG. 11, the ridge-like structure (specifically, exposed surfaces of the first material layer, the second material layer, and the third material layer) may be etched back to relatively recess an outer sidewall of the ridge-like structure. In order to control an etching depth, the ALE may be adopted. The etching depth may be substantially equal to a thickness of the first active layer to be grown subsequently, for example, about 5 nm to 15 nm.

Figure 12:
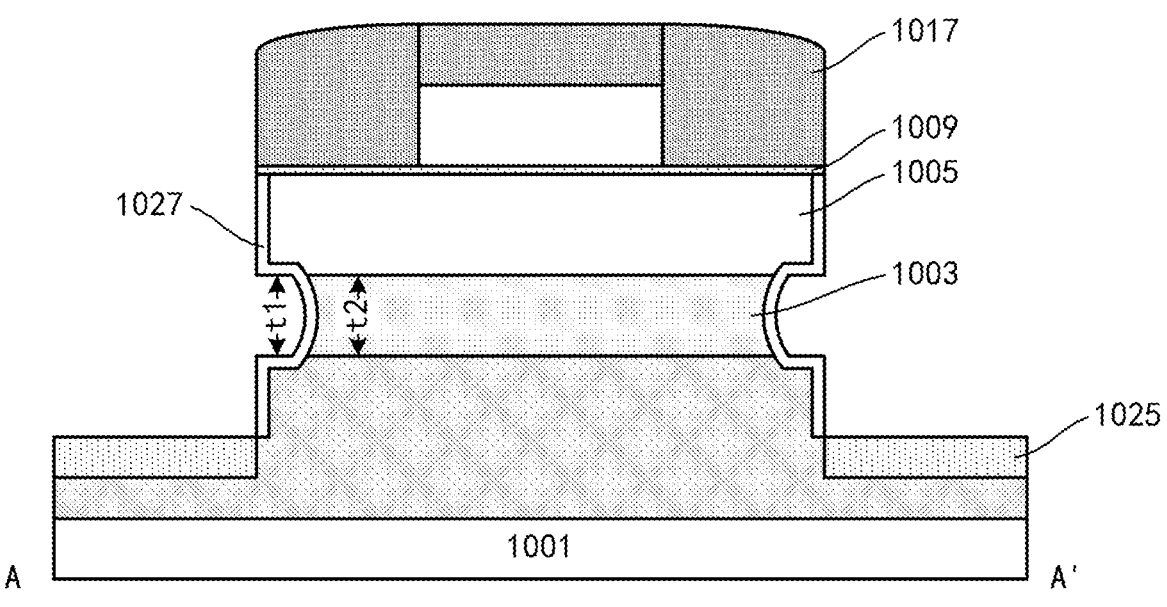

Then, as shown in FIG. 12, a first active layer 1027 may be formed on the sidewall of the ridge-like structure by, for example, a selective epitaxial growth. Due to the selective epitaxial growth, the first active layer 1027 may not be formed on the surface of the first position retaining layer 1021. The first active layer 1027 may then define the channel portion, with a thickness of, for example, about 3 nm to 15 nm. Since the channel portion (although the channel portion may be C-shaped) mainly extends in the vertical direction, the first active layer 1027 (especially a portion of the first active layer 1027 on the sidewall of the second material layer) may also be referred to as the (vertical) channel layer. According to embodiments of the present disclosure, a thickness of the first active layer 1027 (subsequently used as the channel portion) may be determined by an epitaxial growth process, thus better controlling the thickness of the channel portion. The first active layer 1027 may be doped in situ during the epitaxial growth to adjust a threshold voltage of the device.

In FIG. 12, sidewalls of portions of the first active layer 1027 on the sidewalls of the first material layer and the third material layer are shown to be substantially flush with the sidewall of the spacer 1017, which may be achieved by controlling the amount of etching back and the thickness of epitaxial growth to be substantially the same. However, the present disclosure is not limited to this. For example, the sidewalls of the portions of the first active layer 1027 on the sidewalls of the first material layer and the third material layer may be recessed with respect to the sidewall of the spacer 1017, or may even protrude with respect to the sidewall of the spacer 1017.

Here, the above-mentioned etching back may be performed to etch the upper and lower ends of a recess portion upwards and downwards, respectively, such that after the first active layer 1027 is grown, a height t1 of the recess portion may be substantially the same as a thickness t2 of the second material layer 1003. In this way, the gate stacks formed on lest and right sides of the first active layer 1027 may have substantially equal gate lengths. However, the present disclosure is not limited to this. According to embodiments of the present disclosure, a gate length on an outer side of the first active layer 1027 may also be changed by adjusting the etching back amount, thereby changing a proportion of gate lengths on two sides of the first active layer 1027, so as to optimize an influence on the device performance caused by different morphologies of the left and right sides of the C-shaped channel portion.

A material of the first active layer 1027 may be appropriately selected according to the performance requirements of the device for design. For example, the first active layer 1027 may include various semiconductor materials, such as Si, Ge, SiGe, InP, GaAs, InGaAs, and the like. In the example, the first active layer 1027 may include a same material as the first material layer and the third material layer, such as Si.

In the example of FIG. 12, the first active layer 1027 on opposite sides of the ridge-like structure in the second direction may have substantially the same features (e.g., material, dimension, doping characteristic, etc.), and may be symmetrically disposed on opposite sides of the second material layer. However, the present disclosure is not limited to this. As described below, two devices that are opposite to each other may be formed through a single ridge-like structure. According to the performance requirements of the design for the two devices, the first active layer 1027 on opposite sides of the ridge-like structure may have different features, such as differing in at least one of thickness, material, and doping characteristic, which may be achieved by shielding the other device region while growing the first active layer in one device region.

Since the second material layer 1003 is recessed, a gap is formed on an outer side of a portion of the first active layer 1027 corresponding to the second material layer 1003. A gate stack may subsequently be formed in the gap.

Figure 13:
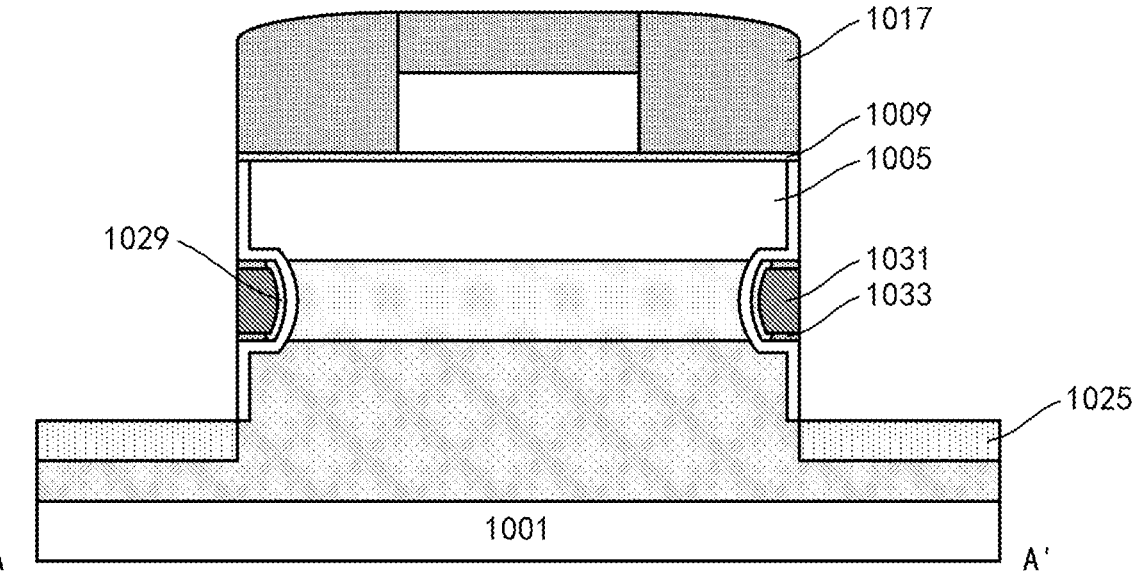

Similar to a process described above in combination with FIG. 7, a spacer may be formed in the gap. For example, as shown in FIG. 13, a spacer position defining layer 1029 and a second position retaining layer 1031 may be formed in the gap, and a spacer 1033 may be formed on and under the second position retaining layer 1031. The spacer position defining layer 1029 and the spacer position defining layer 1019 may have substantially the same characteristics, such as the same material, substantially the same thickness, etc. Similarly, the spacer 1023 and the spacer 1033 may have substantially the same characteristics, such as the same material, substantially the same thickness, etc. The spacer

1033 may extend in the first direction to connect with the previously formed spacer 1023, so that there may be an interface between the spacer 1023 and the spacer 1033. In addition, the first position retaining layer 1021 and the second position retaining layer 1031 may include the same material, so that the first position retaining layer 1021 along with the second position retaining layer 1031 may be subsequently removed by a same etching recipe in a replacement gate process.

After that, a source/drain doping may be performed.

Figure 14:
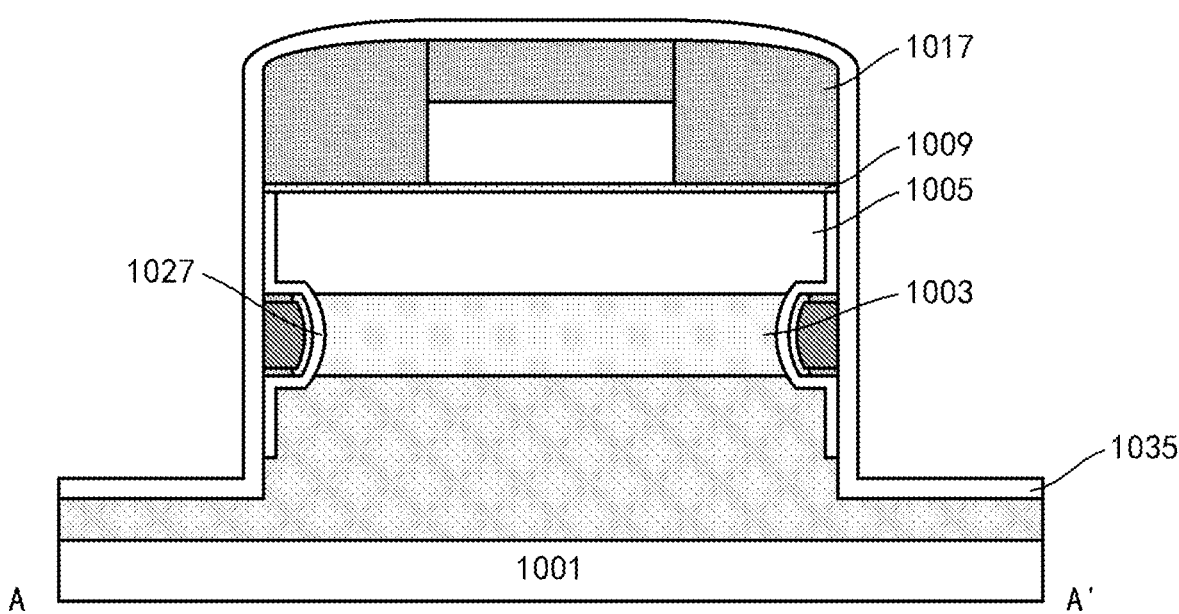

As shown in FIG. 14, a solid-state dopant source layer 1035 may be formed on a structure shown in FIG. 13 by, for example, deposition. The solid-state dopant source layer 1035 may be formed in a substantially conformal manner. For example, the solid-state dopant source layer 1035 may be an oxide containing a dopant, and have a thickness of about 1 nm to 5 nm. The dopant contained in the solid-state dopant source layer 1035 may be used for doping the source/drain portion (and optionally, an exposed surface of the substrate 1001), and thus may have the same conductive type as the source/drain portion that needs to be formed. For example, for the p-type device, the solid-state dopant source layer 1035 may contain a p-type dopant such as B or In; for the n-type device, the solid-state dopant source layer 1035 may contain an n-type dopant such as P or As. A concentration of the dopant in the solid-state dopant source layer 1035 may be about 0.1% to 5%.

In the example, before forming the solid-state dopant source layer 1035, the protective layer 1025 may be selectively etched by, for example, the RIE, to expose the surface of the substrate 1001. In this way, the exposed surface of the substrate 1001 may also be doped to form respective contact regions of the source/drain portions S/D at the lower ends of the two devices.

Figure 15:
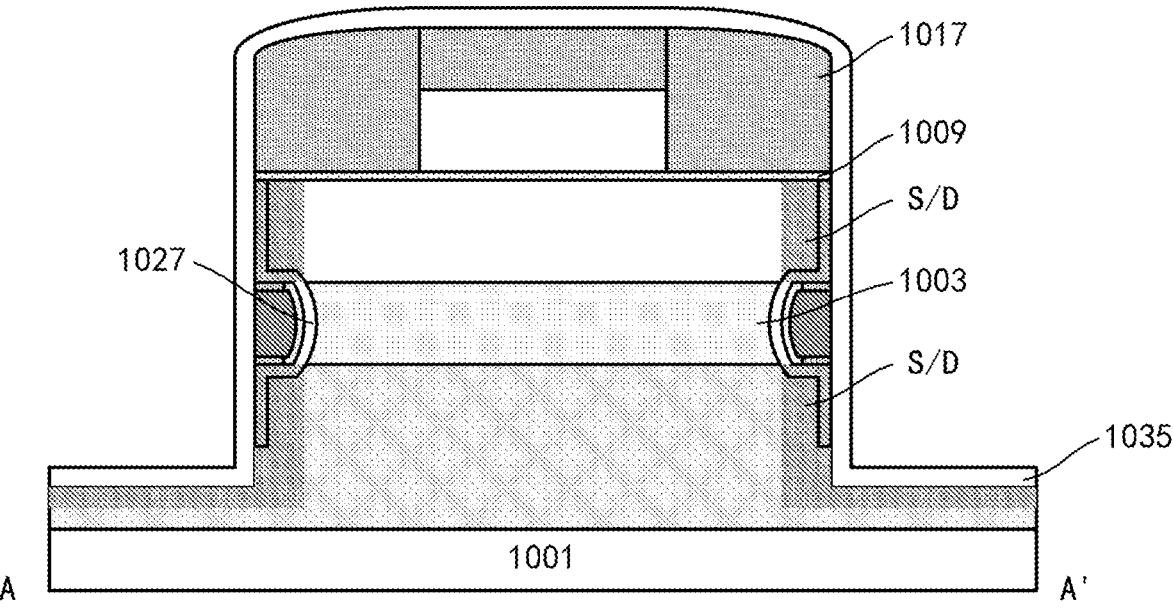

As shown in FIG. 15, the dopant in the solid-state dopant source layer 1035 may be driven into the first material layer and the third material layer by an annealing process to form a source/drain portion S/D (and optionally, the dopant may be driven into the exposed surface of the substrate 1001 to form respective contact regions of the source/drain portions S/D at the lower ends of the two devices). After that, the solid-state dopant source layer 1035 may be removed.

Since the first material layer and the third material layer may have a same material, and the solid-state dopant source layer 1035 may be formed on the surfaces of the first material layer and the third material layer in a substantially conformal manner, drive-in degrees of the dopant from the solid-state dopant source layer 1035 to the first material layer and the third material layer may be substantially the same. Therefore, a (doping concentration) interface of the source/drain portion S/D (and portions of inner sides of the first material layer and the third material layer) may be substantially parallel to the surfaces of the first material layer and the third material layer, that is, they may be in the vertical direction and aligned with each other.

In the example, the first material layer is provided through the upper portion of the substrate 1001. However, the present disclosure is not limited to this. For example, the first material layer may also be an epitaxial layer on the substrate 1001. In this case, the first material layer and the third material layer may be doped in situ during epitaxial growth, rather than using the solid-state dopant source layer for doping.

Figure 16A:
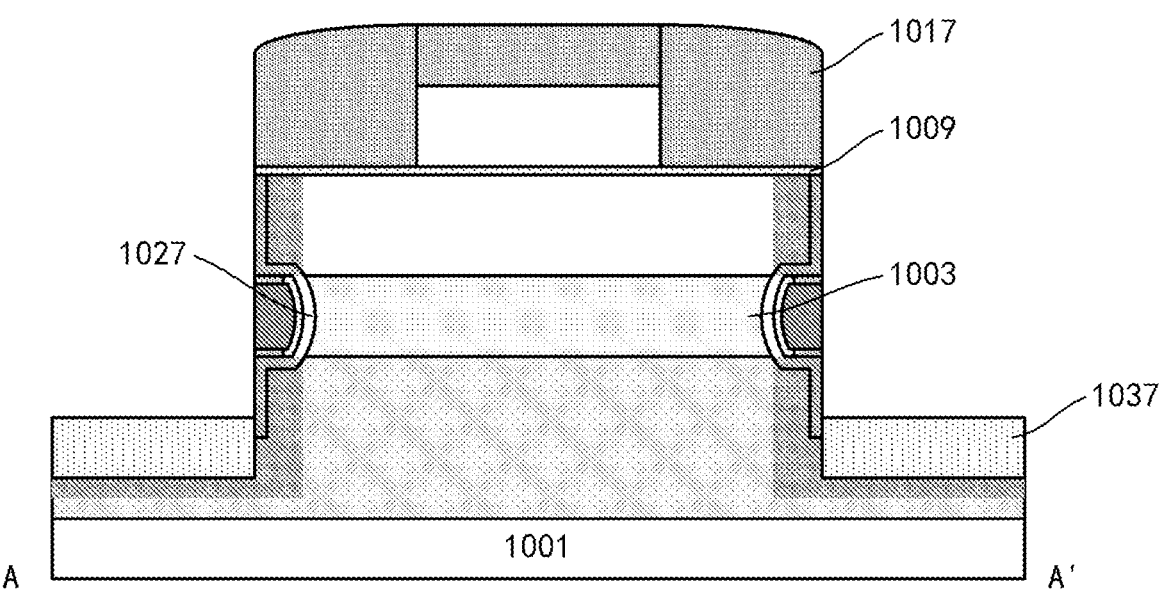
Figure 16B:
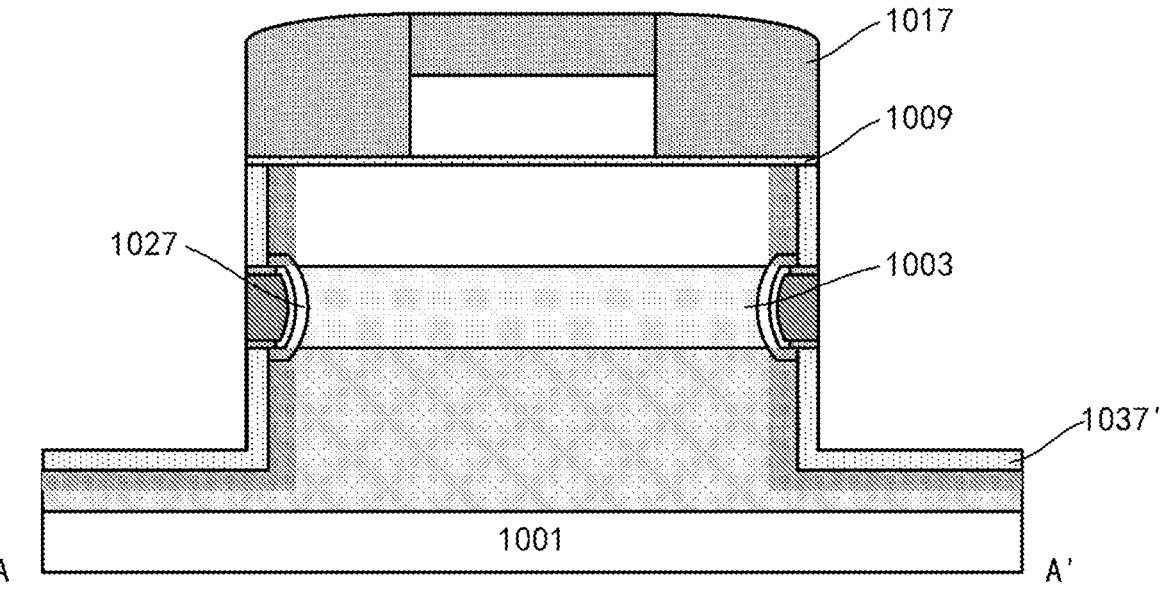

In the grooves around the ridge-like structure, an isolation layer 1037 may be formed, as shown in FIG. 16(*a*). A method of forming the isolation layer may be similar to the method of forming the protective layer 1025 as described above, which will not be described in detail here.

In order to reduce a capacitance between the gate and the source/drain, an overlap between the gate and the source/drain may be further reduced. For example, as shown in FIG. 16(*b*), after removing the solid-phase dopant source layer 1035, the first active layer 1027 formed on the sidewalls of the first material layer and the third material layer may be selectively etched, and even the first material layer and the third material layer may be selectively etched to further recess the source/drain portion S/D in the lateral direction, so that an overlap between the source/drain portion S/D and the first position retaining layer 1021 and the second position retaining layer 1031 (subsequently defining the position of the gate stack) is reduced. A gap released below the hard mask layer 1013 and the spacer 1017 due to the recess of the source/drain portion S/D may be filled with a dielectric 1037' such as a nitrogen oxide or an oxide. The filling may be achieved by deposition (and planarization) followed by etching back. During the etching back, a certain thickness of the dielectric 1037' is left on the surface of the substrate 1001 to form an isolation portion.

Hereinafter, for convenience, description will be made by taking the case shown in FIG. 16(*a*) as an example.

Next, the active region may be defined by using the spacer 1017.

Figure 17:
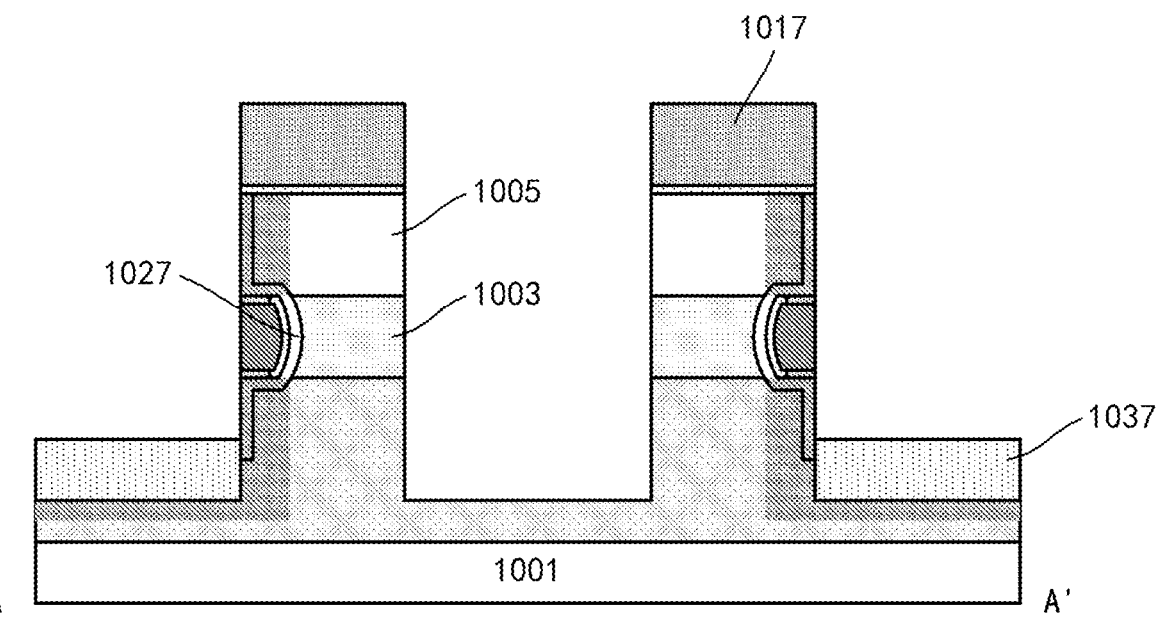

As shown in FIG. 17, the hard mask layer 1013 may be removed by the selective etching such as RIE or the planarization process such as CMP to expose the mandrel 1011. During the process of removing the hard mask layer 1013, a height of the spacer 1017, which is also a nitride in the example, may decrease. Then, the mandrel 1011 may be removed by the selective etching, such as a wet etching using a TMAH solution or a dry etching using the RIE. In this way, a pair of spacers 1017 extending with respect to each other are left on the ridge-like structure (with a decrease in height, a morphology of a top end may also change).

The etching stop layer 1009, the third material layer 1005, the second material layer 1003, and the upper portion of the substrate 1001 may be selectively etched subsequently by using the spacer 1017 as an etching mask by, for example, the RIE in the vertical direction. The etching may be performed into the well region of the substrate 1001. In this way, within a space surrounded by the isolation layer 1037, the third material layer 1005, the second material layer 1003, and the upper portion of the substrate 1001 form a pair of stacks corresponding to the spacer 1017 to define the active region.

Certainly, a formation of the stack for defining the active region is not limited to the spacer pattern transfer technology, but may also be performed by lithography using the photoresist and the like.

Here, for the purpose of the epitaxial growth, the second material layer 1003 used to define the position of the gate stack includes a semiconductor material. For the convenience of the subsequent replacement gate process, the second material layer 1003 may be replaced with a dielectric material to form the third position retaining layer.

Figure 18:
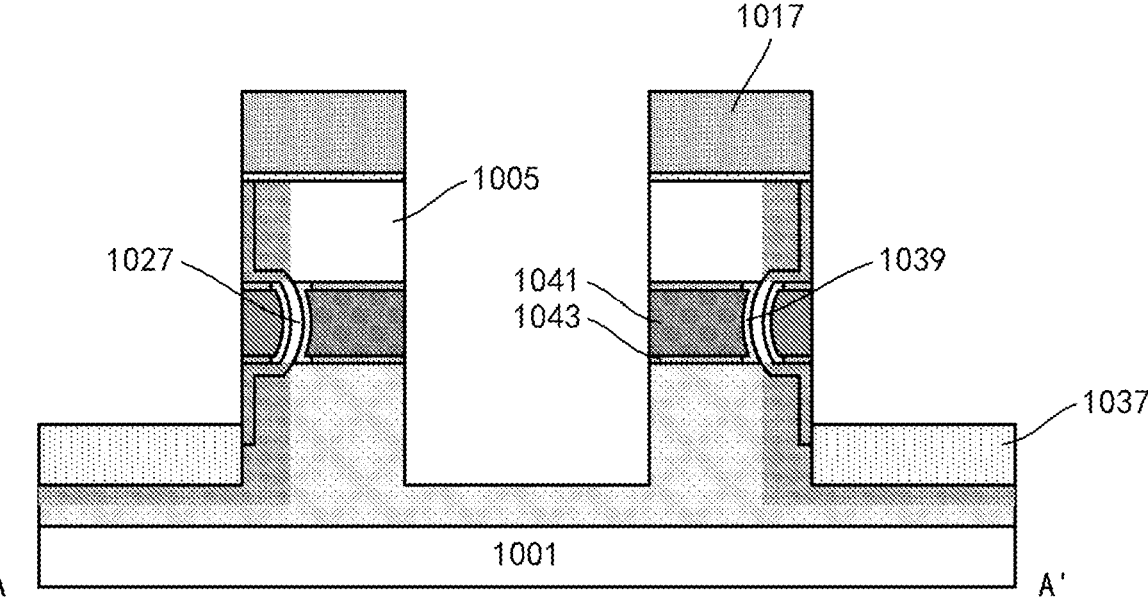

For example, as shown in FIG. 18, the second material layer 1003 (which is SiGe in the example) may be removed by the selective etching with respect to the first active layer 1027, the substrate 1001, and third material layer 1005 (all of which are Si in the example). In this way, a gap (released due to a removal of the second material layer 1003) is formed on a side of the first active layer 1027 opposite to the second position retaining layer 1031. Similarly, a spacer may be formed in the gap. For example, a spacer position defining layer 1039 and a third position retaining layer 1041 may be formed in the gap, and a spacer 1043 may be formed on and under the third position retaining layer 1041. The spacer position defining layer 1039 may have substantially the same characteristics as the spacer position defining layers 1019 and 1029, such as the same material, substantially the same thickness, etc. Similarly, the spacer 1043 may have substantially the same characteristics as the spacers 1023 and 1033, such as the same material, substantially the same thickness, etc. The spacer 1043 may extend in the first direction to connect with the previously formed spacer 1023, so that there may be an interface between the spacer 1043 and the spacer 1023. In addition, the third position retaining layer 1041, the first position retaining layer 1021, and the second position retaining layer 1031 may include the same material, so that the third position retaining layer 1041, the first position retaining layer 1021, and the second position retaining layer 1031 may be subsequently removed by the same etching recipe in the replacement gate process.

In addition, there is currently no isolation layer formed between a pair of stacks (active regions) corresponding to the spacer 1017. As shown in FIG. 19(*a*) and FIG. 19(*b*), an isolation layer 1045 may be formed on the substrate 1001 by, for example, deposition (and planarization) followed by etching back. For example, the isolation layer 1045 may include an oxide and thus is shown as a whole with the previous isolation layer 1037. A top surface of the isolation layer 1045 may be close to, e.g., not lower than (preferably slightly higher than) a top surface of the first material layer (i.e., a top surface of the substrate 1001) or a bottom surface of the second material layer (i.e., a lower surface of the spacer formed on the bottom surfaces of the first position retaining layer 1021, the second position retaining layer 1031, and the third position retaining layer 1041), and not higher than a top surface of the second material layer (i.e., an upper surface of the spacer formed on the top surfaces of the first position retaining layer 1021, the second position retaining layer 1031, and the third position retaining layer 1041) or a bottom surface of the third material layer. This may reduce an overlap between the gate stack and the source/drain portion, especially the lower source/drain portion.

As shown in FIG. 19(*b*), the first position retaining layer 1021, the second position retaining layer 1031, and the third position retaining layer 1041 (which define the position of the gate stack) surround a portion of the first active layer 1027. The portion of the first active layer 1027 may be used as a channel portion. It can be seen that the channel portion is a curved nanosheet in a C-shape (when the nanosheet is narrow, for example, in FIG. 19(*b*), when a size in the vertical direction of the paper plane is small, the nanosheet may become a nanowire). Due to a high etching selectivity of the second material layer 1003 (SiGe) with respect to the first active layer 1025 (Si) during etching, a thickness (in a case of the nanowire, a thickness or a diameter) of the channel portion is substantially determined by a selective growth process of the first active layer 1025. This has a significant advantage over using only an etching method or a photolithography method to determine the thickness, as the epitaxial growth process has much better process control compared to the etching or the photolithography.

Here, there is a spacer position defining layer 1029 between the second position retaining layer 1031 and the first active layer 1027, and a spacer position defining layer 1039 between the third position retaining layer 1041 and the first active layer 1027. In addition, when the second material layer 1003 (which is SiGe in the example) is removed as described above in combination with FIG. 18, the spacer position defining layer 1019 (see FIG. 8(*d*) for example, the spacer position defining layer 1019 is SiGe in the example) formed on the surface of the second material layer 1003 may be removed along with the second material layer 1003.

Figure 20:
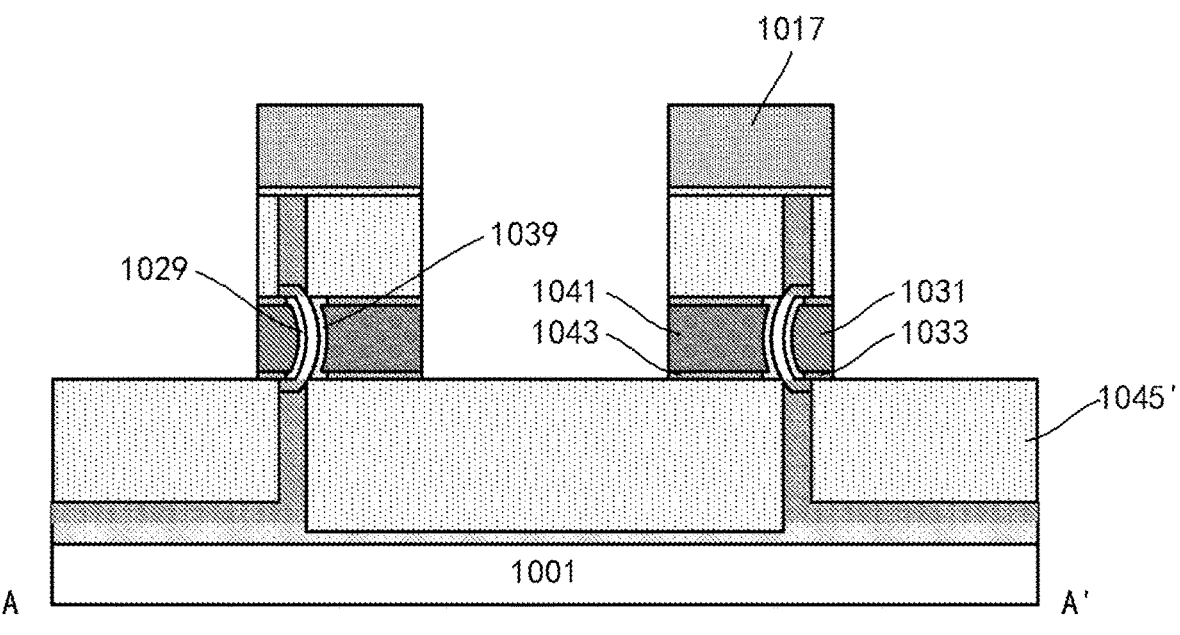

According to another embodiment of the present disclosure, in order to reduce a capacitance, an overlap between the gate and the first and third material layers (where the active/drain portion is formed) may be further reduced. For example, as shown in FIG. 20, after forming the third position retaining layer 1041 as described above, the exposed surfaces of the first material layer and the third material layer may be further recessed by the selective etching. As a result, an overlap between the first and third material layers and the third position retaining layer 1041 (subsequently defining the position of the gate stack) may be reduced. After that, an isolation layer 1045' may be similarly formed. During a formation of the isolation layer 1045', a gap formed below the spacer 1017 due to a recess of the third material layer may also be filled with a dielectric material of the isolation layer 1045'.

In an example of FIG. 20, a structure, which is obtained by performing a process of reducing an overlap described with reference to FIG. 20 in addition to a process of reducing an overlap described with reference to FIG. 16(*b*), is shown. Accordingly, an outer periphery of the source/drain portion S/D is surrounded by the dielectric material. However, the present disclosure is not limited to this. For example, one of or all of the process of reducing overlap described with reference to FIG. 16(*b*) and the process of reducing overlap described with reference to FIG. 20 may be performed.

In the following description, the case shown in FIG. 19(*a*) and FIG. 19(*b*) is still used as an example.

Next, the replacement gate process may be performed to form the gate stack.

Figure 21A:
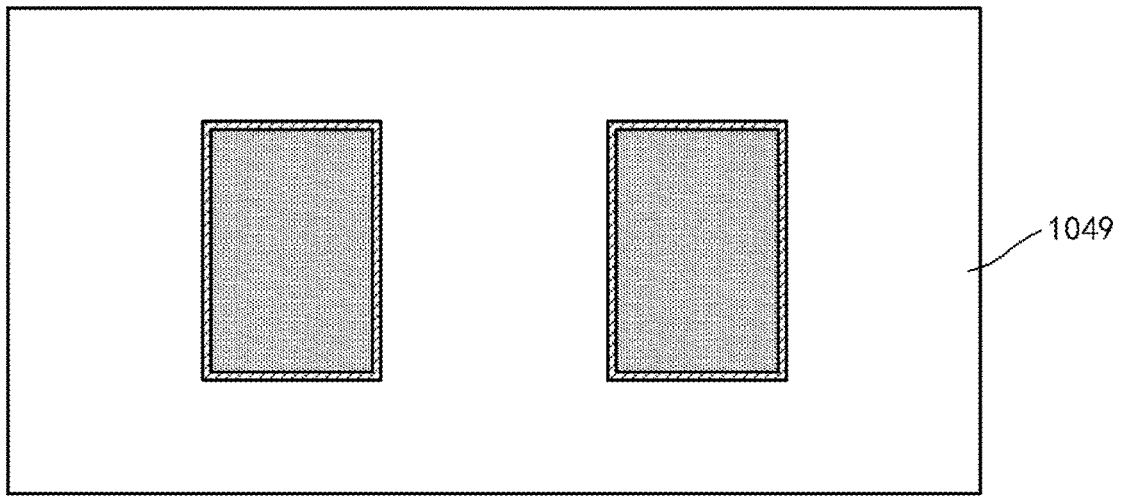
Figure 21B:
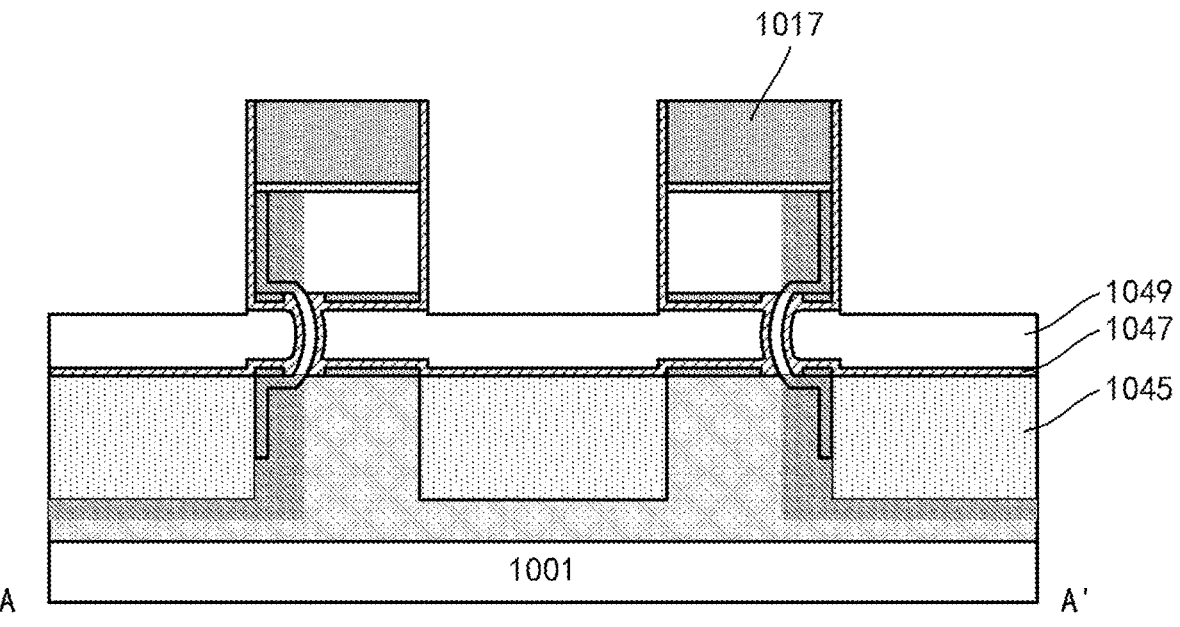
Figure 21C:
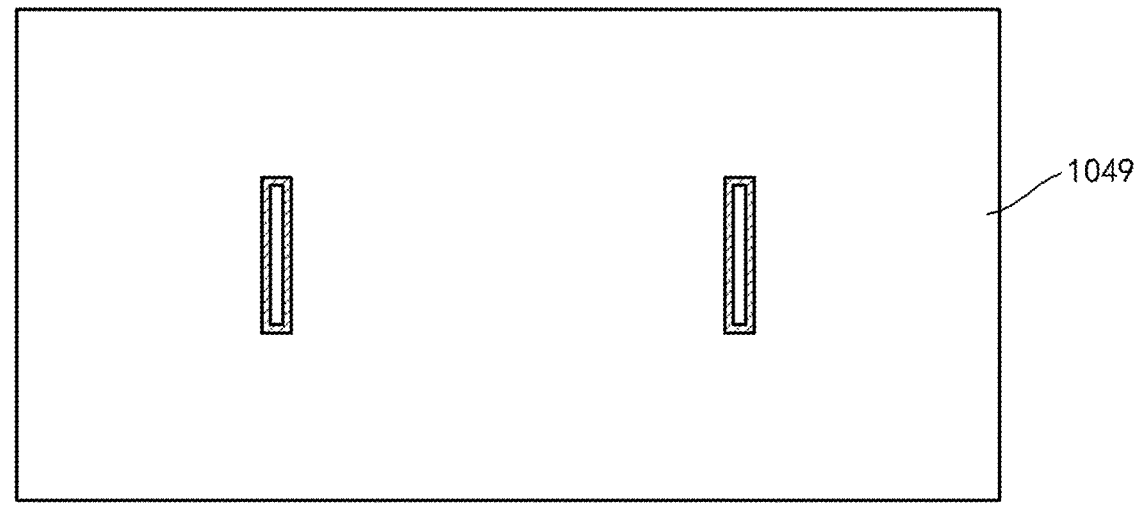

As shown in FIG. 21(*a*) to FIG. 21(*c*), the first position retaining layer 1021, the second position retaining layer 1031, and the third position retaining layer 1041 may be removed by the selective etching, and the spacer position defining layers 1029 and 1039 exposed thereby may be removed. Accordingly, a space for the gate stack, that is, a space where the first position retaining layer 1021, the second position retaining layer 1031, the third position retaining layer 1041, and the spacer position defining layers 1029 and 1039 were originally located, is released.

A gate stack may be formed on the isolation layer 1045. For example, a gate dielectric layer 1047 may be formed in a substantially conformal manner by deposition, and a gate conductor layer 1049 may be formed on the gate dielectric layer 1047. A space between the active regions may be filled with the gate conductor layer 1049. A planarization process such as CMP may be performed on the gate conductor layer 1049, and the CMP may stop at the spacer 1017. Then, the gate conductor layer 1049 may be etched back so that a top surface of the gate conductor layer 1049 is lower than the upper surface of the spacer formed on the top surfaces of the first position retaining layer 1021, the second position retaining layer 1031, and the third position retaining layer 1041 (or a top surface of the second material layer or a bottom surface of the third material layer), so as to reduce a capacitance between the source/drain portion and the gate stack. In this way, an end portion of the formed gate stack is embedded in a space released duo to a removal of the first position retaining layer 1021, the second position retaining layer 1031, and the third position retaining layer 1041 (and the spacer position defining layers 1029 and 1039), and surrounds the channel portion.

For example, the gate dielectric layer 1047 may include a high k gate dielectric such as $HfO_2$, and have a thickness of about 1 nm to 5 nm. Before forming the high k gate dielectric, an interface layer such as an oxide formed by an oxidation process or a deposition such as ALD with a thickness of about 0.3 nm to 1.5 nm, may be formed. The gate conductor layer 1039 may include a work function regulating metal such as titanium nitride (TiN), tantalum nitride (TaN), titanium aluminum carbide (TiAlC), and a gate conductive metal such as tungsten (W).

Currently, the gate stacks of the two devices are connected to each other as a whole. According to the device design, the gate conductor layer 1049 may be disconnected between the two devices by, for example, photolithography, and a landing pad of a gate contact portion may be patterned at the same time.

Figure 22:
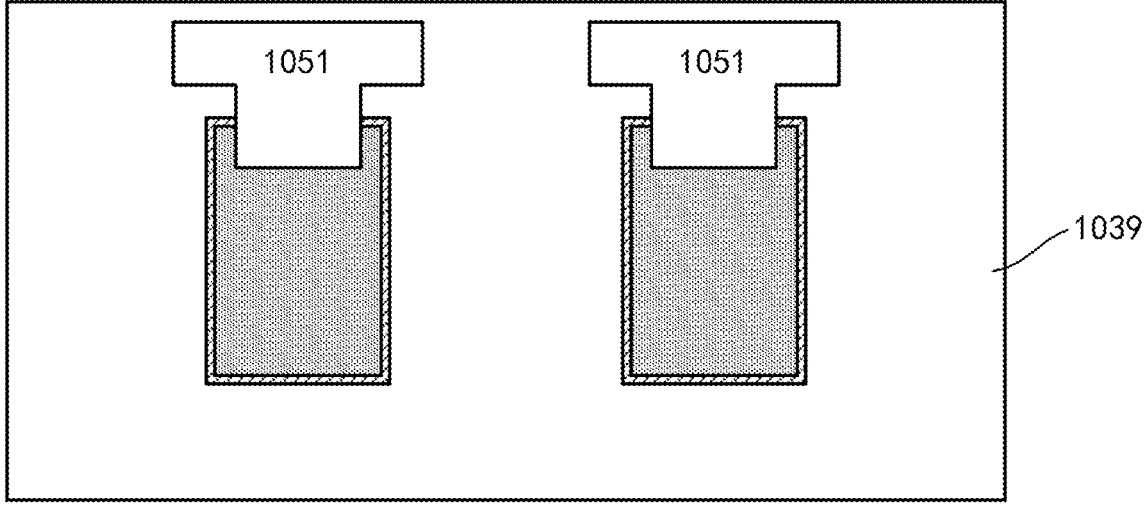
Figure 23A:
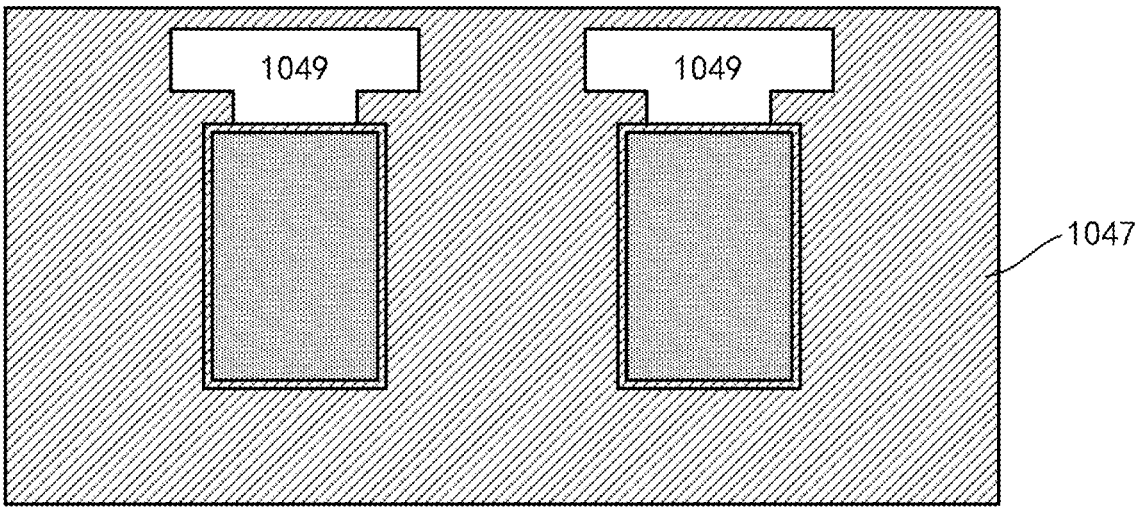
Figure 23B:
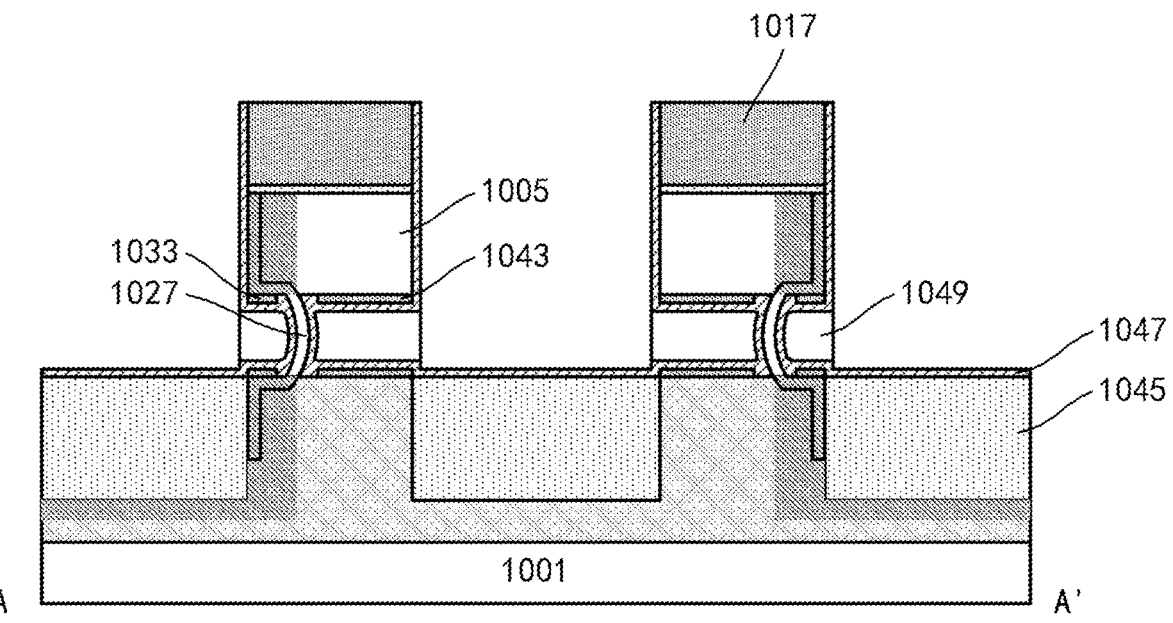
Figure 23C:
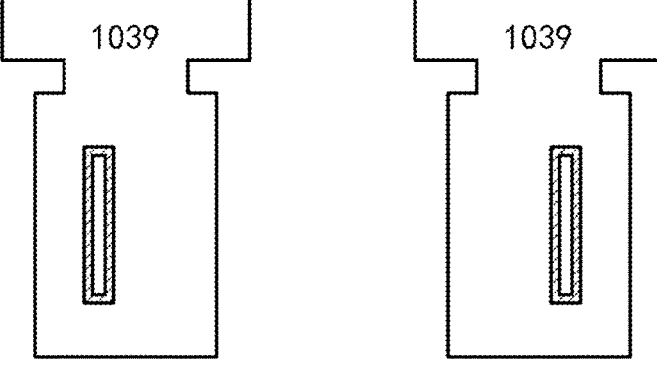

As shown in FIG. 22, a photoresist 1051 may be formed and patterned as shielding a region where the landing pad of the gate contact portion is to be formed while exposing other regions. Then, as shown in FIG. 23(*a*) to FIG. 23(*c*), the photoresist 1051 (and the spacer 1017) may be used as a mask to selectively etch (e.g., RIE) the gate conductor layer 1049. The RIE may be performed in the vertical direction and stop at the gate dielectric layer 1047. After that, the photoresist 1051 may be removed.

Accordingly, the gate conductor layer 1049 may be substantially left and self-aligned under the spacer 1017, except for a portion of the gate conductor layer 1049 protruding on one side (an upper side in FIG. 23(*a*)) of the spacer 1017 to serve as the landing pad. The gate conductor layer 1049 is separated between two opposite devices respectively under opposite spacers 1017, thereby combining with the gate dielectric layer 1047 to define the gate stacks respectively for the two devices.

In the example, the respective landing pads of the two devices are located on a same side of the spacer 1017. However, the present disclosure is not limited to this. For example, the respective landing pads of two devices may be located on different sides of the spacer 1017.

At this point, a fabrication of a device infrastructure has been completed. Subsequently, various contact portions, interconnection structures, etc. may be fabricated.

Figure 24A:
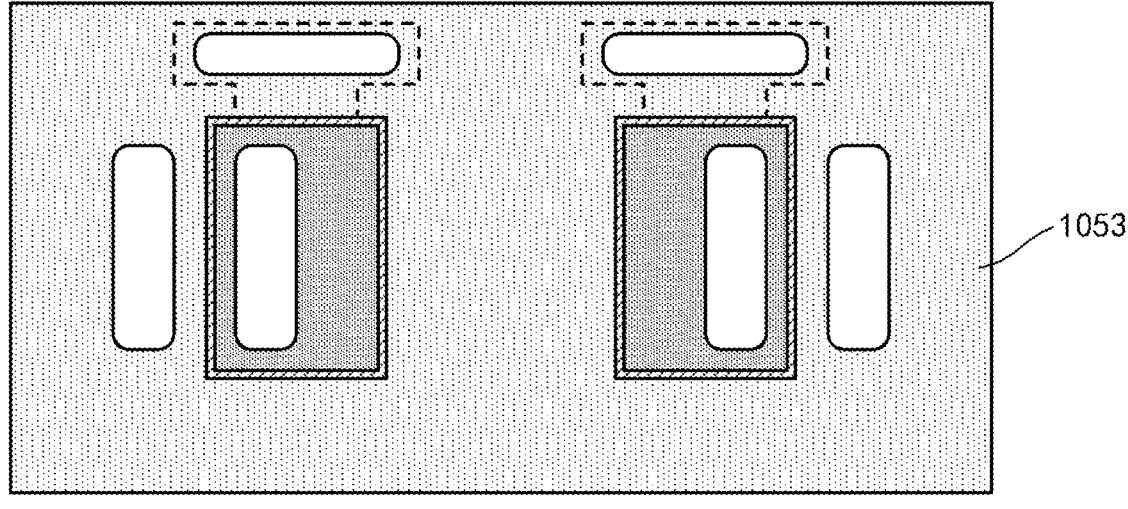
Figure 24B:
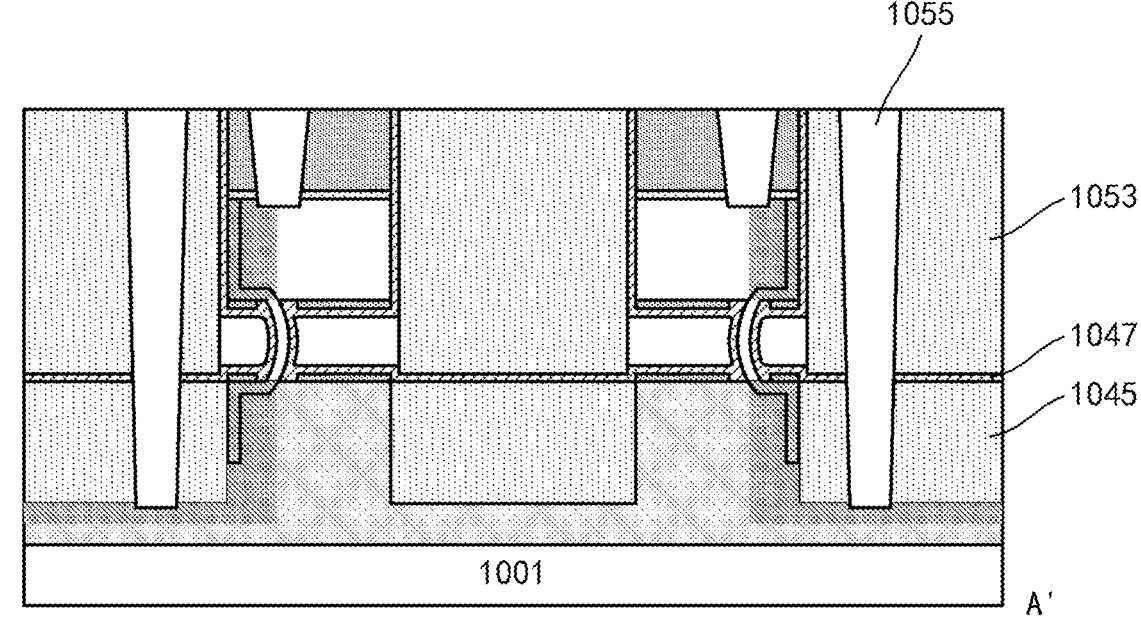

For example, as shown in FIG. 24(*a*) and FIG. 24(*b*), a dielectric layer 1053 may be formed on the substrate by, for example, deposition followed by planarization. Then, a contact hole may be formed and filled with a conductive material such as a metal, so as to form a contact portion 1055. The contact portion 1055 may include a contact portion connected to the upper source/drain portion through the spacer 1017 and the etching stop layer 1009, a contact portion connected to the lower source/drain portion through the dielectric layer 1053 and the isolation layer 1045, and a contact portion connected to the landing pad of the gate conductor layer 1049 through the dielectric layer 1053. As shown in FIG. 24(*a*) and FIG. 24(*b*), contact portions to contact regions of the respective lower source/drain portions of the two devices may be located on opposite sides (left side and right side in FIG. 24(*a*) and FIG. 24(*b*)) of the active region, respectively.

Figure 25:
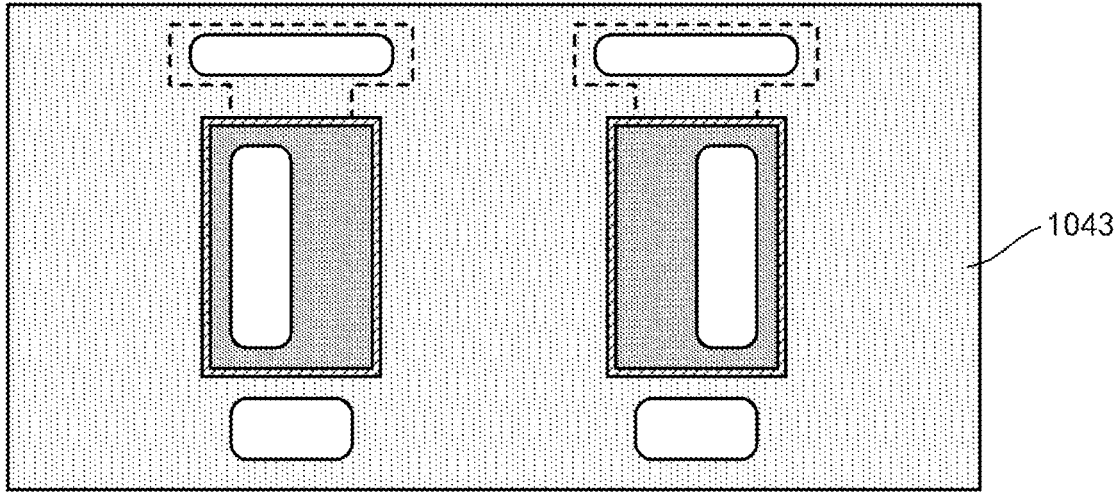

According to other embodiments of the present disclosure, the contact portion to the contact region of the lower source/drain portion and the contact portion to the landing pad of the gate conductor layer of the corresponding device may be located on opposite sides of the active region of the corresponding device, respectively, as shown in FIG. 25.

In the above-mentioned embodiment, the gate-all-around device is formed. However, the present disclosure is not limited to this. For example, two gate stacks separated from each other may be formed on opposite sides of the channel layer.

Figure 26A:
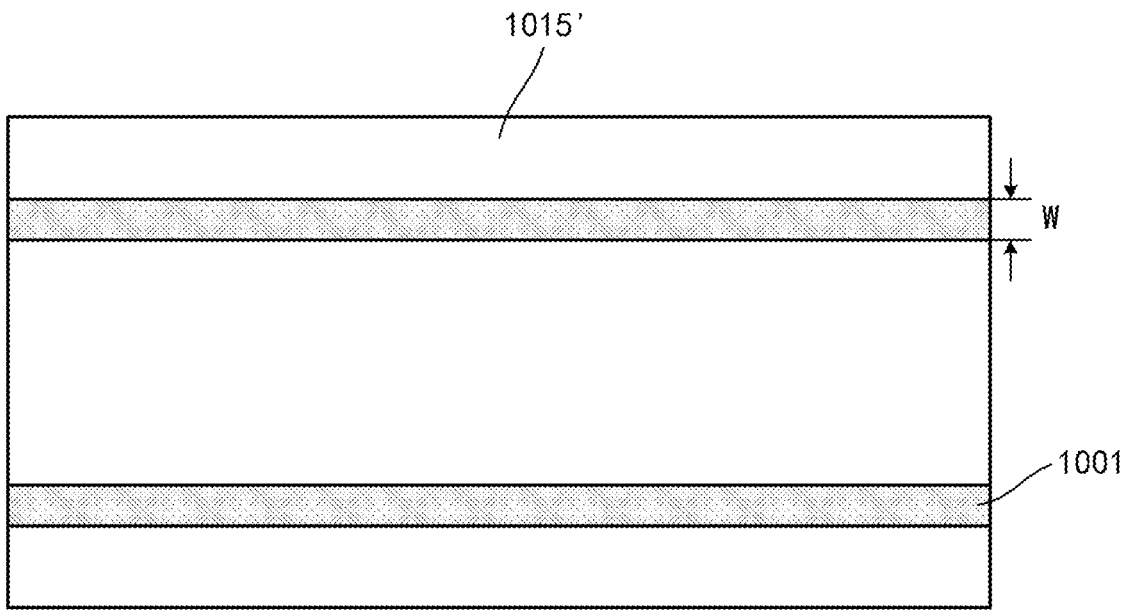
Figure 26B:
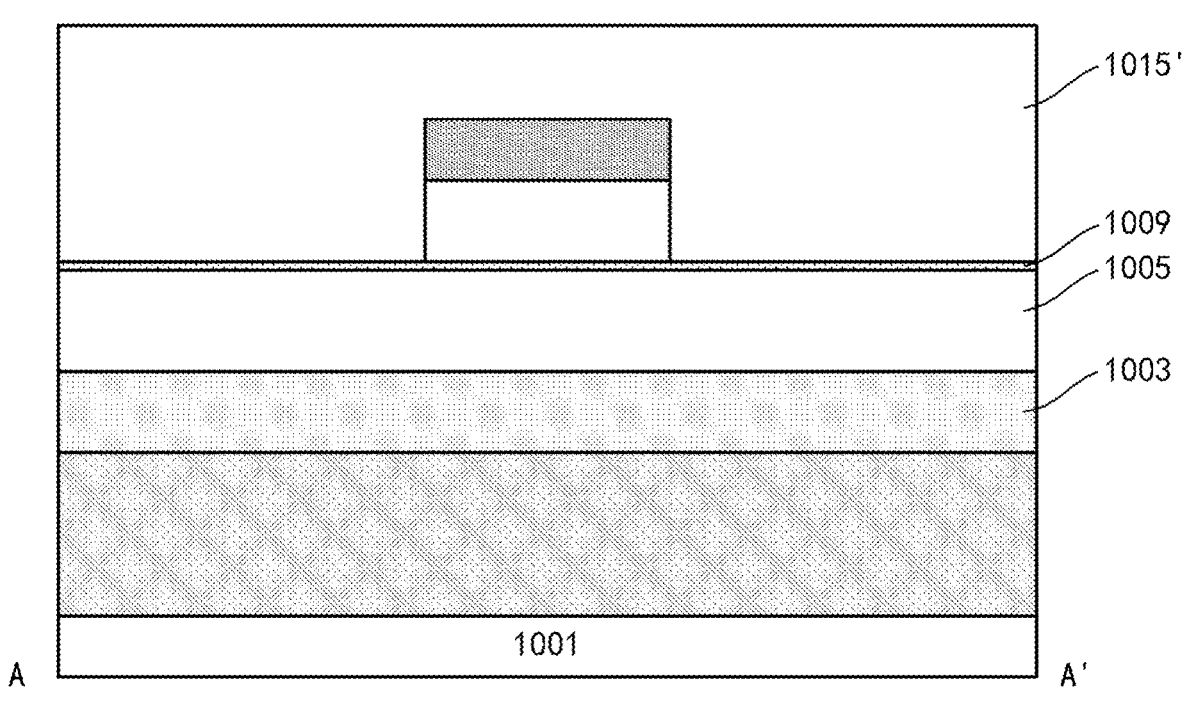
Figure 26C:
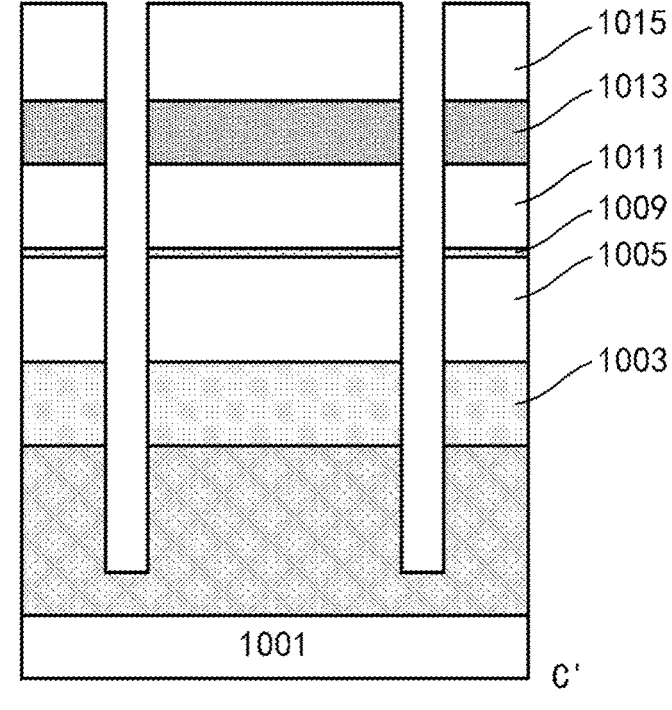
Figure 32A:
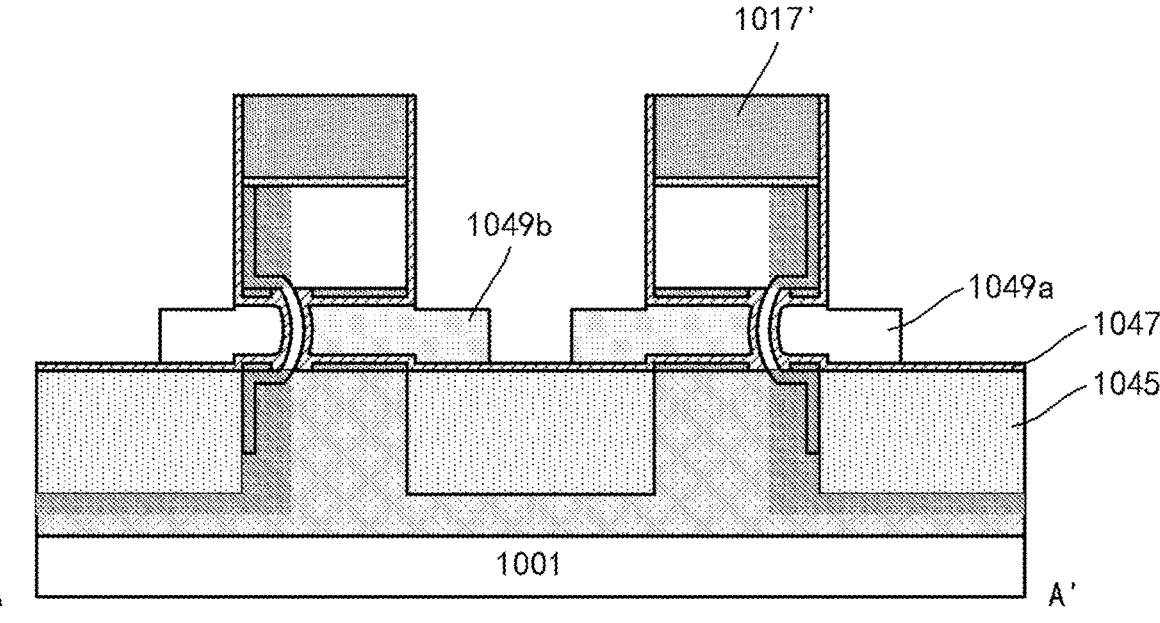
Figure 32B:
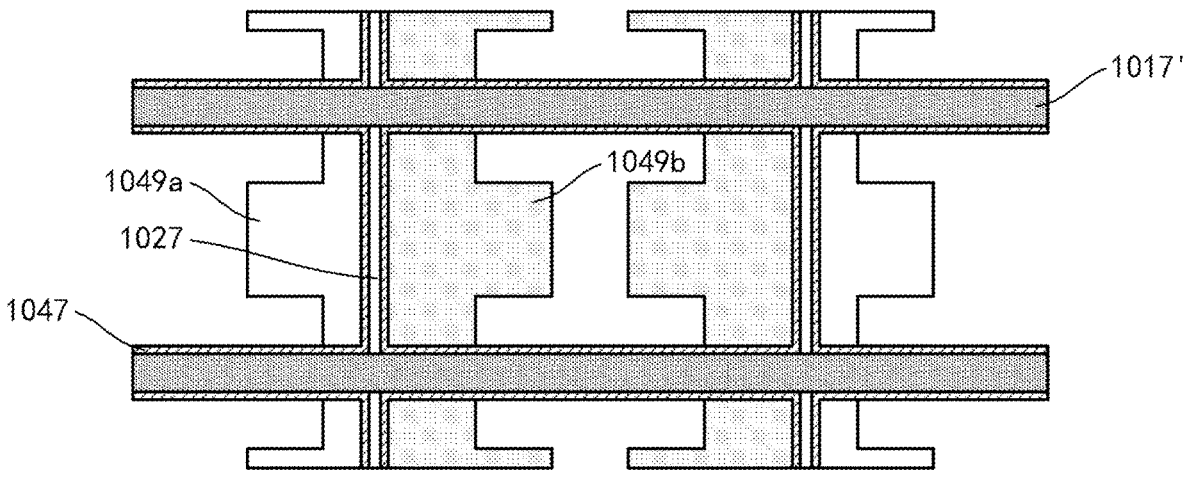

FIG. 26(*a*) to FIG. 32(*b*) schematically illustrate some stages in a process of manufacturing a semiconductor device according to another embodiment of the present disclosure. Hereinafter, a difference of the embodiment from the above-mentioned embodiment will be mainly described.

As described above in combination with FIG. 1 to FIG. 3, a second material layer 1003 and a third material layer 1005 may be sequentially formed on the substrate 1001. An etching stop layer 1009, a mandrel 1011 and a hard mask layer 1013 patterned as a strip shape extending in the first direction may be formed on the third material layer 1005.

Unlike the above-mentioned embodiment in which the spacer is directly formed on the sidewall of the mandrel 1011 (and the hard mask layer 1013) which is continuous in the first direction, according to this embodiment, a range of the active region of the device in the first direction may be defined first.

For example, as shown in FIG. 26(*a*) to FIG. 26(*c*), a photoresist 1015' may be formed on the structure (the photoresist 1007 is removed) shown in FIG. 3, and patterned by photolithography to occupy a certain range in the first direction, e.g., a strip shape extending in the second direction. Here, a plurality of (e.g., 3) device active regions adjacent in the first direction are shown, and a plurality of (e.g., 3) strip shapes of the photoresist 1015' are correspondingly shown (see FIG. 26(*a*), where only a portion of the strip shapes on the upper and lower sides is shown due to a picture limitation). The photoresist 1015' may be used as an etching mask to selectively etch lower layers sequentially by, for example, RIE in the vertical direction. The etching may be performed into the substrate 1001, especially into the well region of the substrate 1001, thereby forming a groove in the substrate 1001. A distance between device active regions adjacent in the first direction, or a width of the groove between device active regions, is shown as W in FIG. 26(*a*).

Then, as shown in FIG. 27(*a*) to FIG. 27(*d*), a spacer 1017' may be formed, for example, as described above in combination with FIG. 4. In the embodiment, a thickness of a nitride deposited in a spacer formation process may be selected to be greater than W/2, so that the groove may be fully filled with the nitride and the nitride may be retained in the anisotropic etching in the spacer formation process. Accordingly, the spacer 1017' thus formed not only has a portion on a sidewall of the mandrel 1011 (and the hard mask layer 1013) extending in the first direction described above in combination with FIG. 4, but also has a portion extending in the second direction (i.e., a portion filled into the groove). The portion of the spacer 1017' extending in the second direction may form a shielding layer to shield opposite sides of the device active region in the first direction, so as to avoid an influence of a subsequent process. The shielding layer may be used as an isolation portion between device active regions adjacent in the first direction.

After that, the process in the above-mentioned embodiment may be substantially performed, except that processing is not required at the opposite ends in the first direction. For example, as described above in combination with FIG. 9 to FIG. 20, a first active layer 1027 may be formed, and a second position retaining layer 1031 and a third position retaining layer 1041 may be formed on opposite sides of the first active layer 1027 in the second direction, respectively.

A spacer 1033 is formed on and under the second position retaining layer 1031, and the spacer 1033 is formed by means of the spacer position defining layer 1029. A spacer 1043 is formed on and under the third position retaining layer 1041, and the spacer 1043 is formed by means of the spacer position defining layer 1039, so as to obtain a structure shown in FIG. 28(*a*) and FIG. 28(*b*). In the embodiment, the first position retaining layer 1021 on opposite sides of the active region in the first direction will not be formed (there are the above-mentioned shielding layer, i.e., the material of the spacer 1017', on the opposite sides of the active region in the first direction).

In addition, since the spacer 1033 and the spacer 1043 may be formed in different steps, respectively, the spacer 1033 and the spacer 1043 may be formed differently, e.g., with different thicknesses and/or different materials. For example, the spacer position defining layer 1029 and the spacer position defining layer 1039 may be grown with different thicknesses, respectively, so that the spacer 1033 and the spacer 1043 thus formed may have different thicknesses.

Figure 28A:
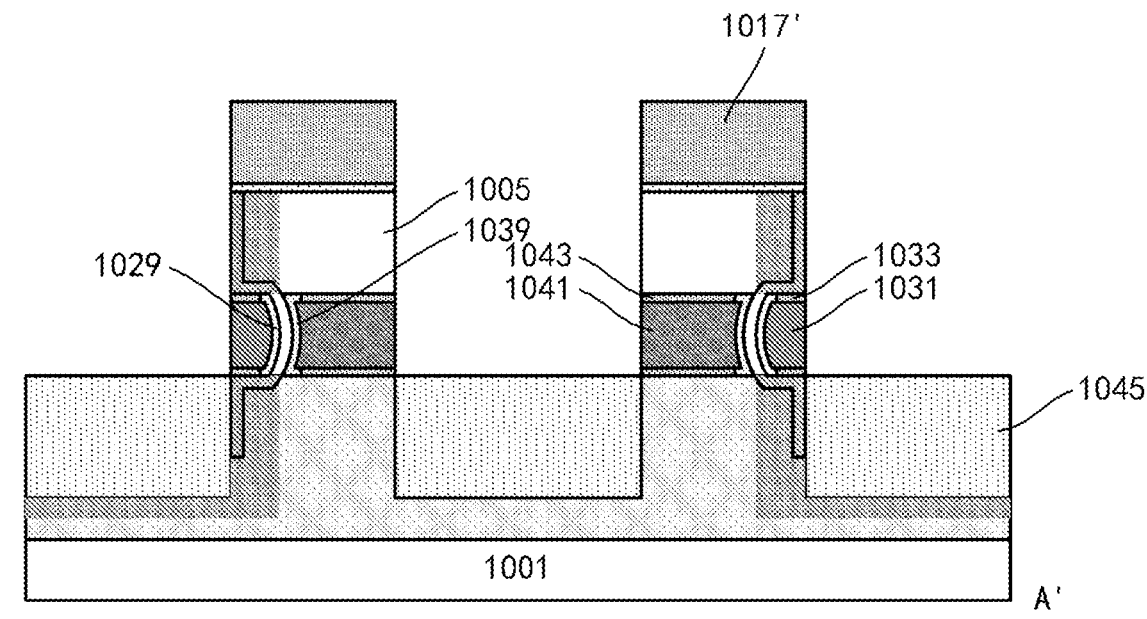
Figure 28B:
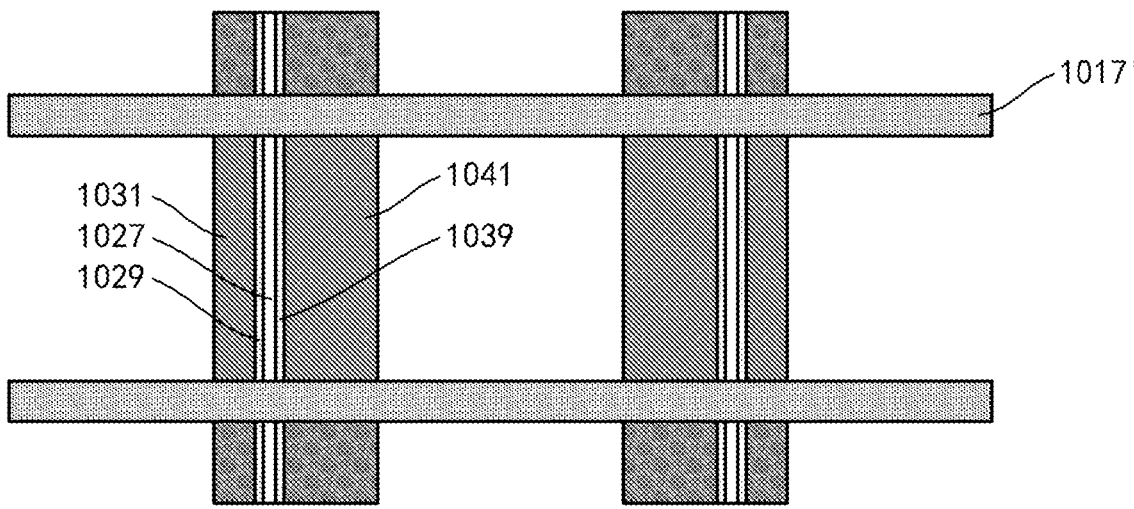

As shown in FIG. 28(*b*), the second position retaining layer 1031 and the third position retaining layer 1041 are located on opposite sides of the first active layer 1027 in the second direction, respectively, and define the position of the gate stack. A portion where the first active layer 1027 overlaps with the second position retaining layer 1031 and the third position retaining layer 1041 (or the gate stack) may be used as a channel portion. In addition, in the first direction, a portion of the spacer 1017' extending in the second direction may be used as an isolation between active regions of the device.

A replacement gate process may also be performed.

Figure 29:
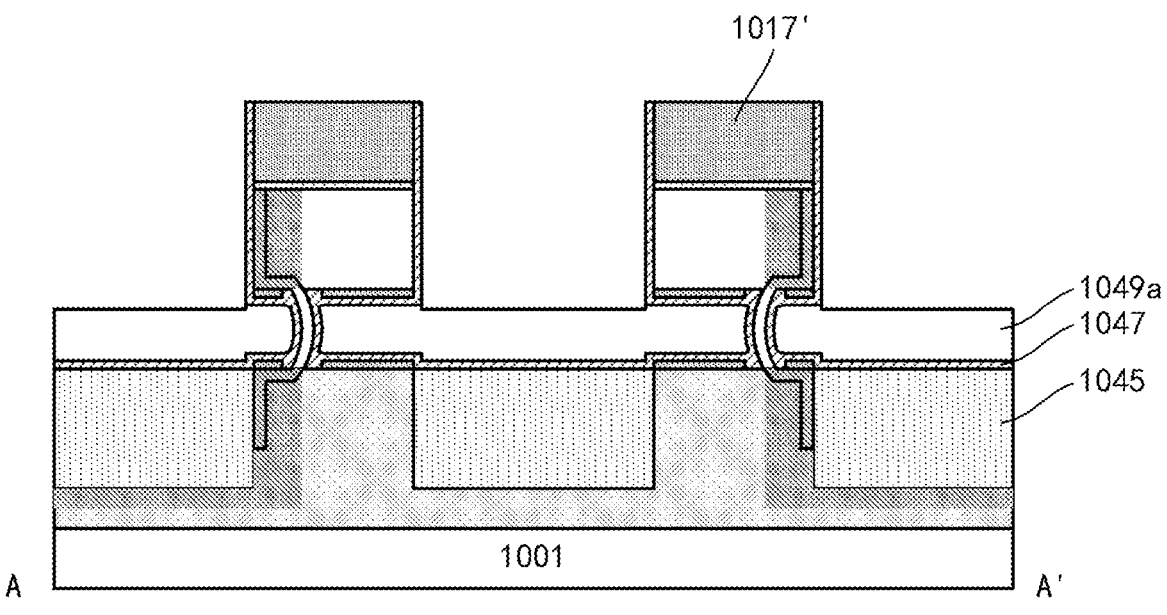

As shown in FIG. 29, the second position retaining layer 1031 and the third position retaining layer 1041 may be removed by the selective etching, and the spacer position defining layers 1029 and 1039 exposed thereby may be removed. Accordingly, a space for the gate stack, that is, a space where the second position retaining layer 1031, the third position retaining layer 1041, and the spacer position defining layers 1029 and 1039 were originally located, is released. A gate stack (the gate dielectric layer 1047 and a first gate conductor layer 1049*a*) may be formed on the isolation layer 1045. Regarding the formation of the gate stack, reference may be made to the description above in combination with FIG. 21(*a*) to FIG. 21(*c*). A difference lies in that in the embodiment, the gate stack is formed as separate portions on opposite sides of the first active layer 1027 in the second direction, occupying a space where the second position retaining layer 1031 (and the spacer position defining layer 1029) was originally located and a space where the third position retaining layer 1041 (and the spacer position defining layer 1039) was originally located, respectively. Similarly, there are the spacer 1033 and the spacer 1043 on and under the gate stack.

Portions (also referred to the first gate stack and the second gate stack, respectively) of the gate stack located on opposite sides of the first active layer 1027 may adopt a same configuration (e.g., having the same gate dielectric layer and gate conductor layer), or different configurations (e.g., having different gate dielectric layers and/or gate conductor layers), so as to optimize the device performance.

Figure 30:
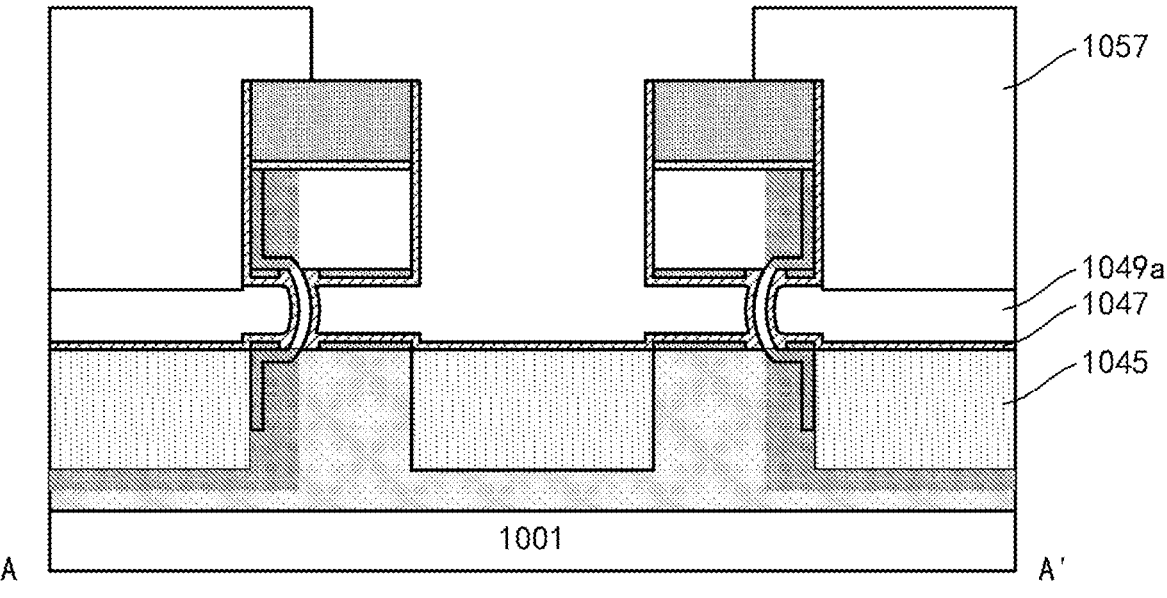

For example, as shown in FIG. 30, a photoresist 1057 may be used to shield the gate stack (for example, the first gate stack) of each device on one side of the first active layer 1027 while expose the gate stack (for example, the second gate stack) on the other side of the first active layer 1027.

The gate conductor layer (and optionally, the gate dielectric layer) of the exposed gate stack may be removed by the selective etching. After that, the photoresist 1057 may be removed.

Figure 31:
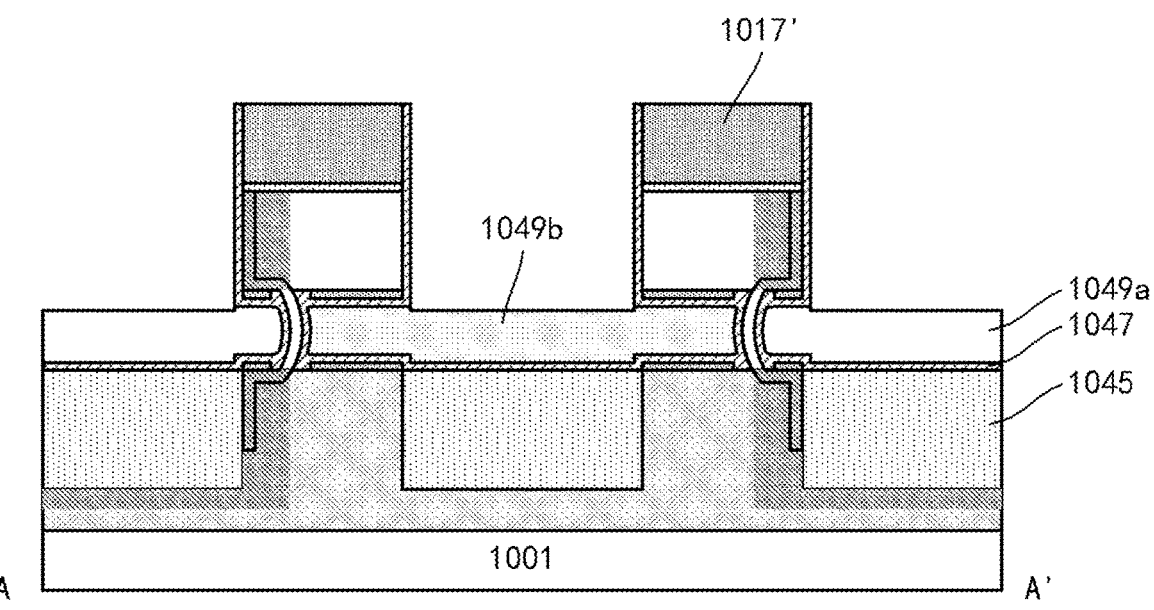

As shown in FIG. 31, a second gate conductor layer 1049*b* may be additionally formed in the second gate stack by depositing followed by etching back an additional gate conductor material. The etching back of the additional gate conductor material allows for a removal of the additional gate conductor material at the first gate stack and a retention of the additional gate conductor material at the second gate stack. When the gate dielectric layer 1047 at the second gate stack is also removed, an additional gate dielectric layer may further be formed.

Similarly, according to the device design, the gate conductor layer may be disconnected between different devices, and the landing pad of the gate contact portion may also be patterned at the same time.

For example, as shown in FIG. 32(*a*) and FIG. 32(*b*), the first gate conductor layer 1049*a* and the second gate conductor layer 1049*b* may be patterned to extend mainly below the spacer 1017' (a space where the second position retaining layer 1031 and the third position retaining layer 1041 were originally located) and have a protrusion to serve as the landing pad of the gate contact portion.

Subsequently, various contact portions, interconnection structures, etc. may be fabricated as described above, which will not be described in detail here.

The semiconductor device according to embodiments of the present disclosure may be applied to various electronic apparatuses. For example, an integrated circuit (IC) may be formed based on the semiconductor device, and an electronic apparatus may be constructed accordingly. Therefore, the present disclosure further provides an electronic apparatus including the above-mentioned semiconductor device. The electronic apparatus may further include a display screen that cooperates with the integrated circuit, a wireless transceiver that cooperates with the integrated circuit, and the like. The electronic apparatus may include, for example, a smart phone, a personal computer (PC), a tablet computer, an artificial intelligence device, a wearable device, a mobile power supply, an automotive electronic device, a communication device, or an Internet of Things (IoT) device, and so on.

According to embodiments of the present disclosure, a method of manufacturing System on Chip (SoC) is further provided. The method may include the above-mentioned method. Specifically, a variety of devices may be integrated on the chip, at least some of which are manufactured according to the method of the present disclosure.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:

a channel portion on a substrate, wherein the channel portion comprises a curved nanosheet or nanowire with a C-shaped cross-section;

a first source/drain portion and a second source/drain portion respectively located at upper and lower ends of the channel portion with respect to the substrate;

a first gate stack and a second gate stack located on opposite sides of the channel portion, wherein each of the first gate stack and the second gate stack comprises a gate dielectric layer and a gate conductor layer;

a first spacer located between the first gate stack and the first source/drain portion and between the first gate stack and the second source/drain portion respectively; and a second spacer located between the second gate stack and the first source/drain portion and between the second gate stack and the second source/drain portion respectively, wherein an upper surface of the first spacer and an upper surface of the gate dielectric layer of the first gate stack are coplanar, and wherein an upper surface of the second spacer and an upper surface of the gate dielectric layer of the second gate stack are coplanar.

2. The semiconductor device according to claim 1, wherein the first spacer and the second spacer have thicknesses different from each other.

3. The semiconductor device according to claim 1, wherein the first spacer and the second spacer comprise dielectrics different from each other.

4. The semiconductor device according to claim 1, wherein the first gate stack and the second gate stack form a gate stack surrounding an outer periphery of the channel portion.

5. The semiconductor device according to claim 4, wherein the first spacer and the second spacer form a spacer surrounding the outer periphery of the channel portion.

6. The semiconductor device according to claim 5, further comprising:

a third spacer and a fourth spacer on opposite sides of the channel portion in a first direction, wherein the first spacer and the second spacer are located on opposite sides in a second direction intersecting the first direction, wherein the first spacer is respectively connected to the third spacer and the fourth spacer, and there is an interface at each of a connection position of the first spacer and the third spacer and a connection position of the first spacer and the fourth spacer; the second spacer is respectively connected to the third spacer and the fourth spacer, and there is an interface at each of a connection position of the second spacer and the third spacer and a connection position of the second spacer and the fourth spacer.

7. The semiconductor device according to claim 6, wherein portions of the first spacer, the second spacer, the third spacer, and the fourth spacer on the gate stack are coplanar, and portions of the first spacer, the second spacer, the third spacer, and the fourth spacer under the gate stack are coplanar.

8. The semiconductor device according to claim 1, wherein the first spacer and the second spacer are self-aligned with the upper and lower ends of the channel portion.

9. The semiconductor device according to claim 1, wherein the curved nanosheet or nanowire comprises a first sidewall and a second sidewall having a C-shaped opening towards a same direction in a cross-section perpendicular to a surface of the substrate, wherein the first sidewall and the second sidewall extend between the source/drain portions at the upper and lower ends of the channel portion, the first gate stack overlaps with the first sidewall, and the second gate stack overlaps with the second sidewall.

10. The semiconductor device according to claim 9, wherein the curved nanosheet or nanowire has a uniform thickness or diameter.

11. The semiconductor device according to claim 1, further comprising:

a vertically extending active layer, wherein the active layer comprises a middle portion extending between an upper portion and a lower portion of the active layer, and the middle portion of the active layer forms the curved nanosheet or nanowire;

a first semiconductor layer on a sidewall of the upper portion of the active layer; and a second semiconductor layer on a sidewall of the lower portion of the active layer, wherein the first source/drain portion and the second source/drain portion comprise a doping region in the first semiconductor layer and the second semiconductor layer.

12. The semiconductor device according to claim 11, wherein the first semiconductor layer extends from the sidewall of the upper portion of the active layer towards a side away from an opening of the C-shaped cross-section, and the second semiconductor layer extends from the sidewall of the upper portion of the active layer towards the side away from the opening of the C-shaped cross-section.

13. The semiconductor device according to claim 1, wherein at least a portion of each of the first gate stack and the second gate stack close to a side of the channel portion is coplanar with the channel portion.

14. The semiconductor device according to claim 1, wherein the channel portion and/or the source/drain portion contain a single crystal semiconductor material.

15. The semiconductor device according to claim 1, wherein there are a plurality of the semiconductor devices on the substrate, and the C-shaped cross-section of at least one pair of semiconductor devices among the plurality of the semiconductor devices face away from each other.

16. The semiconductor device according to claim 1, wherein a gate length of the first gate stack is equal to a gate length of the second gate stack.

17. An electronic apparatus, comprising the semiconductor device according to claim 1.

18. The electronic apparatus according to claim 17, wherein the electronic apparatus comprises a smart phone, a personal computer, a tablet computer, an artificial intelligence device, a wearable device, a mobile power supply, an automotive electronic device, a communication device, or an Internet of Things device.

* * * * *